(12) United States Patent
Takamiya et al.

(10) Patent No.: US 9,167,699 B2
(45) Date of Patent: Oct. 20, 2015

(54) SEMICONDUCTOR DEVICE

(71) Applicant: FUJI ELECTRIC CO., LTD., Kawasaki (JP)

(72) Inventors: Yoshikazu Takamiya, Matsumoto (JP); Kazunaga Onishi, Matsumoto (JP); Yoshihiro Kodaira, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 94 days.

(21) Appl. No.: 13/892,665

(22) Filed: May 13, 2013

(65) Prior Publication Data

US 2013/0250535 A1 Sep. 26, 2013

Related U.S. Application Data

(63) Continuation of application No. PCT/JP2011/068804, filed on Aug. 19, 2011.

(30) Foreign Application Priority Data

Nov. 16, 2010 (JP) ................................. 2010-255762

(51) Int. Cl.
*H05K 1/16* (2006.01)
*H01L 23/48* (2006.01)
(Continued)

(52) U.S. Cl.
CPC .............. *H05K 1/181* (2013.01); *H01L 23/043* (2013.01); *H01L 23/3735* (2013.01);
(Continued)

(58) Field of Classification Search
CPC ............ H01L 23/043; H01L 23/49811; H01L 25/072; H01L 23/3735; H01L 2224/45124; H01L 2224/32225; H01L 2224/73265; H01L 24/48; H01L 24/45; H01L 25/18; H01L 2924/13055; H01L 2224/48227; H01L 2224/48091; H01L 2224/48137; H01L 2924/00014; H01L 2924/00012; H01L 2924/00; H05K 1/181; H05K 1/02

USPC .......... 174/250–268; 361/752, 760, 792–795, 361/783, 785
See application file for complete search history.

(56) References Cited

U.S. PATENT DOCUMENTS 5,306,949 A * 4/1994 Yamada et al. ................ 257/690
5,463,251 A * 10/1995 Fujita et al. .................... 257/717
(Continued)

FOREIGN PATENT DOCUMENTS

EP 0702509 A2 3/1996
JP 03-025963 A 2/1991
(Continued)

OTHER PUBLICATIONS

International Search Report issued Nov. 8, 2011 for PCT/JP2011/068804.

(Continued)

*Primary Examiner* — Ishwarbhai B Patel
(74) *Attorney, Agent, or Firm* — Rossi, Kimms & McDowell LLP

(57) ABSTRACT

Aspects of the invention are directed to a power module including a metal base, an insulating substrate which is attached to the metal base, a semiconductor chip and a control terminal which are attached to a circuit pattern of the insulating substrate, and a resin case which is attached to the metal base. The control terminal can include a penetration portion which penetrates a cover of the resin case, an L-shaped processed portion which is connected to the penetration portion, and a connection portion which is connected to the L-shaped processed portion. A protrusion portion can be installed in a portion of the control terminal, which penetrates the cover. The protrusion portion can be in contact with a protrusion receiving portion which is configured with a front surface of the cover. The L-shaped processed portion can be in contact with a convex portion in a rear surface of the cover.

12 Claims, 17 Drawing Sheets

(51) Int. Cl.
  *H01L 23/52* (2006.01)
  *H05K 1/18* (2006.01)
  *H01L 23/043* (2006.01)
  *H01L 25/07* (2006.01)
  *H05K 1/02* (2006.01)
  *H01L 23/373* (2006.01)
  *H01L 23/498* (2006.01)
  *H01L 25/18* (2006.01)
  *H01L 23/00* (2006.01)

(52) U.S. Cl.
  CPC ....... *H01L 23/49811* (2013.01); *H01L 25/072* (2013.01); *H05K 1/02* (2013.01); *H05K 1/18* (2013.01); *H01L 24/45* (2013.01); *H01L 24/48* (2013.01); *H01L 25/18* (2013.01); *H01L 2224/32225* (2013.01); *H01L 2224/45124* (2013.01); *H01L 2224/48091* (2013.01); *H01L 2224/48137* (2013.01); *H01L 2224/48227* (2013.01); *H01L 2224/73265* (2013.01); *H01L 2924/1305* (2013.01); *H01L 2924/13055* (2013.01)

(56) References Cited

U.S. PATENT DOCUMENTS

| | | | |
|---|---|---|---|
| 8,399,976 B2* | 3/2013 | Matsumoto et al. | 257/690 |
| 2003/0015778 A1* | 1/2003 | Soyano et al. | 257/678 |
| 2007/0246841 A1 | 10/2007 | Yamamoto et al. | |
| 2008/0217756 A1 | 9/2008 | Boettcher et al. | |

FOREIGN PATENT DOCUMENTS

| | | |
|---|---|---|
| JP | 08-162582 A | 6/1996 |
| JP | 09-283682 A | 10/1997 |
| JP | 10-065098 A | 3/1998 |
| JP | 2000-208686 A | 7/2000 |
| JP | 2007-311749 A | 11/2007 |

OTHER PUBLICATIONS

Extended European Search Report issued in European counterpart application No. EP11840778.2, dated May 30, 2014.

Partial translation of "Notification of Reasons for Refusal" issued in corresponding Japanese Patent Application No. 2012-544134 dated Jul. 1, 2014.

* cited by examiner

SEMICONDUCTOR DEVICE

CROSS-REFERENCE TO RELATED APPLICATIONS

This application is a continuation of International Application No. PCT/JP2011/068804, filed on Aug. 19, 2011, which is based on and claims priority to Japanese Patent Application No. JP 2010-255762, filed on Nov. 16, 2010. The disclosure of the Japanese priority application and the PCT application in their entirety, including the drawings, claims, and the specification thereof, are incorporated herein by reference.

BACKGROUND OF THE INVENTION

1. Field of the Invention

Embodiments of the invention relate to semiconductor devices such as power semiconductor modules (hereinafter, simply referred to as a power modules), where a plurality of semiconductor chips are contained in the same package.

2. Related Art

FIG. 14 is a schematic cross-sectional diagram illustrating a power module in the related art. As illustrated in FIG. 14, a package 501 of a power module 500 is configured to include a metal base 51, an insulating substrate 52, a main terminal 55 and a control terminal 56 which are attached to a circuit pattern 52a of the insulating substrate 52, and a resin case 57. In the power module 500, a semiconductor chip 54 including semiconductor elements is attached on the insulating substrate 52 of the package 501.

In the insulating substrate 52, the circuit pattern 52a is installed on the front-surface side of an insulating layer 52b, and a rear copper foil 52c is installed on the rear-surface side thereof. The front surface of the metal base 51 is attached to the rear copper foil 52c of the insulating substrate 52 through solder (not illustrated). The rear surface of the semiconductor chip 54, one end of the main terminal 55, and one end of the control terminal 56 are attached to the circuit pattern 52a of the insulating substrate 52 through solder (not illustrated).

Electrodes of the semiconductor elements (not illustrated) installed on the front surface of the semiconductor chip 54 and the circuit patterns 52a are electrically connected to each other through bonding wires 60, and the circuit patterns 52a are electrically connected to each other through bonding wires 60. A resin case 57 is adhered to a circumference of the metal base 51 so as to cover the front-surface side of the metal base 51. The resin case 57 is configured so that a sidewall 58 and cover 59 are integrally formed. Each of the other ends of the main terminal 55 and the control terminal 56 penetrates the cover 59 of the resin case 57 to be exposed to an outer side of the resin case 57.

Next, a configuration of a vicinity M of the control terminal 56 of the power module 500 will be described in detail. FIG. 15 is a cross-sectional diagram illustrating main components in a vicinity of the control terminal of the power module illustrated in FIG. 14. In FIG. 15, the insulating substrate 52 configured to include the circuit pattern 52a, the insulating layer 52b, and the rear copper foil 52c are simplified in the illustration. The control terminal 56 is formed so as to be integrated with a control terminal block 61. The control terminal block 61 is fit into the resin case 57.

The control terminal 56 has a bent portion T at the portion which is closer to the insulating substrate 22 than the control terminal block 61 integrated with the control terminal 56. The control terminal 56 functions as a spring due to elasticity of the bent portion T to press down the insulating substrate 52, so that the control terminal 56 secures a conduction state with respect to the circuit pattern 52a of the insulating substrate 52. The end portion of the control terminal 56, which is exposed to the outer side of the resin case 57, is connected to an external wire line through a connector (not illustrated).

At the time of attachment/detachment of the connector, a stress is exerted on the control terminal 56 in the direction facing the insulating substrate 52 or in the direction being separated from the insulating substrate 52. Therefore, at the time of attachment of the connector, the stress is exerted on the control terminal 56 in the direction facing the insulating substrate 52. However, since the control terminal 56 is fit into the resin case 57 through the control terminal block 61, the stress exerted on the control terminal 56 is prevented from being transferred to the insulating substrate 52 through the control terminal 56. Accordingly, no stress is exerted on the insulating substrate 52.

As a power module where the control terminal and the control terminal block are integrally formed and the control terminal block is fit into the resin case in this manner, the following apparatus is proposed. Lead pins of signal terminals are retained in a signal terminal block, and the signal terminal block is retained in an outer case. The lead pin has a bent portion between the portion where the lead pin is retained and the distal end portion thereof in the package. When the outer case is mounted on a metal base plate, the lead pin of which the free length (before compression) is set to be longer than the compressed length is compressed so as to press the circuit substrate (for example, refer to Patent Literature 1 listed below).

FIGS. 16(a) and 16(b) are cross-sectional diagrams illustrating main components of a power module in another example of the related art. The power module 600 illustrated in FIGS. 16(a) and 16(b) is different from the power module 500 illustrated in FIG. 14 in terms of a configuration of a vicinity M of control terminal 56. FIG. 16(a) illustrates a cross-sectional diagram of main components in the vicinity M of the control terminal 56 of the power module 600. FIG. 16(b) illustrates a cross-sectional diagram of the main components as the vicinity M of the control terminal 56 illustrated in FIG. 16(a) is seen from the side of the sidewall 58 of the resin case 57 (in the direction indicated by a white leftward arrow N).

As illustrated in FIGS. 16(a) and 16(b), the front surface of the metal base 51 is attached to the rear copper foil 52c of the insulating substrate 52 through solder 53. The control terminal 56 is configured to include a penetration portion 56a which penetrates a penetration hole 59a of a cover 59 of the resin case 57, an L-shaped processed portion 56b which is connected to an end of the penetration portion 56a to constitute an L-shaped cross section together with the penetration portion 56a, and a connection portion 56c of which the one end is connected to the L-shaped processed portion 56b and of which the other end is fixed to the insulating substrate 52 by soldering. The other end of the connection portion 56c is perpendicularly bent, and the perpendicularly-bent end of the connection portion 56c is attached to the insulating substrate 52 through solder 62.

The end of the penetration portion 56a opposite to the end of the penetration portion 56a, which is connected to the L-shaped processed portion 56b, is exposed to the outer side of the resin case 57. A protrusion portion 63 which is in contact with the rear surface 59c of the cover 59 of the resin case 57 after the completion of assembly of the power module 600 is installed in the portion of the penetration portion 56a, which penetrates the resin case 57. Since the protrusion portion 63 is in contact with the rear surface 59c of the cover 59 of the resin case 57, the control terminal 56 is not pulled out in the direction from the resin case 57 to the outer side (in the direction indicated by a white upward arrow P of FIG. 16(b)).

An external wire line is connected to the end of the penetration portion 56a of the control terminal 56, which is exposed to the outer side of the resin case 57, through the connector 64. Although not illustrated in FIGS. 16(a) and 16(b), the penetration portion 56a of the control terminal 56 is connected into a socket 64a of the connector 64. In the case of detaching the connector 64 from the penetration portion 56a of the control terminal 56, a stress is exerted on the control terminal 56 in the direction P being separated from the insulating substrate 52 (in the direction indicated by a white upward arrow P).

Because the protrusion portion 63 formed in the control terminal 56 is in contact with the rear surface 59c of the cover 59 of the resin case 57, the stress exerted on the control terminal 56 in the direction P being separated from the insulating substrate 56 may be prevented. Therefore, in the case of detaching the connector 64 from the penetration portion 56a of the control terminal 56, the stress exerted on the control terminal 56 is not transferred to the insulating substrate 56 through the control terminal 56.

As a power module having the configuration where no stress is exerted on the insulating substrate at the time of detaching the connector from the control terminal in this manner, the following apparatus is proposed. A spring is installed in the end of the control terminal, which is closer to the insulating substrate, and the control terminal is in contact with the insulating substrate by compressing the spring. Alternatively, a member having the same operation as a spring is installed in the end of the control terminal, which is closer to the insulating substrate, and the control terminal is in contact with the insulating substrate by using the member. In addition, a hook is installed in the control terminal to prevent the control terminal from being moved in the direction being separated from the insulating substrate. On the other hand, as a power module having the configuration where no pressure is exerted on the insulating substrate through the control terminal at the time of attaching the connector to the control terminal, an apparatus where the portion of the control terminal, which is exposed to the outer side of the resin case, is allowed to be bent to be in contact with the surface of the resin case is proposed. For example, refer to US Patent Application Publication No. 2008/0217756 (also referred to herein as "Patent Literature 2").

However, in the power module disclosed in Japanese Patent Publication No. JP 2000-208686 (also referred to herein as "Patent Literature 1") and the power module 500 illustrated in FIGS. 14 and 15 described above, a process for integrally formed the control terminal 56 in the control terminal block 61 and a process for fitting the control terminal block 61 into the resin case 57 are required, so that production cost is increased.

In addition, in the power module 600 illustrated in FIGS. 16(a) and 16(b), at the time of attaching the connector 64, a stress is exerted on the control terminal 56 in the direction (white downward arrow) Q facing the insulating substrate 52. Therefore, at the time of attaching the connector 64, the stress exerted on the control terminal 56 is transferred to the insulating substrate 52 through the control terminal 56, so that the pressure is exerted on the insulating substrate 52. Accordingly, at the portion R corresponding to the control terminal 56 of the insulating substrate 52, the insulating substrate 52 is fractured, so that dielectric strength is decreased. Otherwise, the insulating substrate 52 is depressed, and thus, that the control terminal 56 is displaced, so that the solder 62 attaching the control terminal 56 and the insulating substrate 52 is damaged. Therefore, there is a problem in that the reliability of the power module 600 is deteriorated.

In addition, in the power module disclosed in Patent Literature 2 described above, in the case of attaching the connector to the control terminal, it is not disclosed that the pressure exerted on the insulating substrate through the control terminal is blocked by the protrusion portion installed in the control terminal. Therefore, in the case of attaching the connector to the control terminal, the pressure exerted on the insulating substrate cannot be suppressed.

Thus, there is a need in the art for an improved semiconductor device.

SUMMARY OF THE INVENTION

Embodiments of the invention are directed to this and other needs. Some embodiments provide a semiconductor device having high dielectric strength and a semiconductor device having high reliability.

The invention has many aspects, some of which are described below. According to an aspect of the present invention, there is provided a semiconductor device including: an insulating substrate; a control terminal which is attached to the insulating substrate to be electrically connected to a semiconductor chip mounted to the insulating substrate; a case which the control terminal penetrates; a first stopping portion which prevents movement of the control terminal in a direction facing the insulating substrate; and a second stopping portion which prevents movement of the control terminal in a direction being separated from the insulating substrate.

In addition, in the semiconductor device according to the above aspect of the present invention, the control terminal includes: a penetration portion which penetrates a cover of the case; an L-shaped member which is connected to the penetration portion to be substantially perpendicular to the penetration portion to form an L shape together with the penetration portion and is in contact with a rear surface of the cover of the case. In addition, the control terminal includes a protrusion portion which is installed in the penetration portion and is in contact with a front surface of the cover of the case. The first stopping portion is the protrusion portion. The second stopping portion is the L-shaped member.

In addition, in the semiconductor device according to the above aspect of the present invention, the protrusion portion is in contact with a protrusion receiving portion which is configured with the front surface of the cover of the case, and the protrusion portion constitutes the first stopping portion. The L-shaped member is in contact with a convex portion which is formed in a rear surface of the cover of the case, and the L-shaped member constitutes the second stopping portion.

In addition, in the semiconductor device according to the above aspect of the present invention, the control terminal further includes a connection portion of which the one end is connected to a bottom surface portion of the L-shaped member and of which the other end is connected to the insulating substrate. A side surface of the L-shaped member is substantially perpendicular to a side surface of the penetration portion. A side surface of the connection portion is substantially perpendicular to the side surface of the L-shaped member and is substantially parallel to the side surface of the penetration portion. The protrusion portion is formed with the side surface of the penetration portion.

In addition, in the semiconductor device according to the above aspect of the present invention, the penetration portion, the L-shaped member, and the connection portion of the control terminal is a continuous member which is cut out from one sheet of a metal plate.

In addition, in the semiconductor device according to the above aspect of the present invention, the control terminal includes a penetration portion which penetrates a cover of the case. The control terminal includes a first protrusion portion which is installed to the penetration portion and is in contact with a front surface of the cover of the case. The control terminal includes a second protrusion portion which is installed in the penetration portion to be separated from the first protrusion portion and is in contact with a rear surface of the cover of the case. The first stopping portion is the first protrusion portion. The second stopping portion is the second protrusion portion.

In addition, in the semiconductor device according to the above aspect of the present invention, the control terminal includes a penetration portion which penetrates a cover of the case. The control terminal includes a notch portion which is installed in the penetration portion to interpose the cover of the case and is in contact with front and rear surfaces of the cover of the case. The first stopping portion is a sidewall of the notch portion which is in contact with the front surface of the cover of the case. The second stopping portion is a sidewall of the notch portion which is in contact with the rear surface of the cover of the case.

In addition, in the semiconductor device according to the above aspect of the present invention, the control terminal further includes: an L-shaped member which is connected to the penetration portion to be substantially perpendicular to the penetration portion to form an L shape together with the penetration portion; and a connection portion of which the one end is connected to a bottom surface portion of the L-shaped member and of which the other end is attached to the insulating substrate.

In addition, in order to address above-described problems and achieve the object of the invention, according to another aspect of the present invention, there is provided a semiconductor device including: an insulating substrate; a case which covers the insulating substrate; a control terminal which is attached to the insulating substrate and penetrates the case; a first stopping portion which is installed in a portion of the control terminal, which is exposed to an outer side of the case, to be in contact with the case from the outer side of the case; and a second stopping portion which is installed in a portion of the control terminal, which is in an inner side of the case, to be in contact with the case from the inner side of the case.

In addition, in order to address above-described problems and achieve the object of the invention, according to still another aspect of the present invention, there is provided a semiconductor device including: a metal member; an insulating substrate which is attached to a front surface of the metal member; a semiconductor chip and a main terminal which are attached to a circuit pattern of the insulating substrate; a case which is attached to the metal member to cover a front-surface side of the metal member; a penetration hole which is installed in the case; a control terminal which includes a connection portion attached to the circuit pattern, a penetration portion supported by the penetration hole, a first stopping portion formed in the penetration portion, and a second stopping portion formed in the penetration portion; a first fastening portion which is configured to include a sidewall of the penetration hole and a front surface of the case and is in contact with the first stopping portion so as to fasten the first stopping portion; and a second fastening portion which is configured to include a sidewall of the penetration hole and a rear surface of the case and is in contact with the second stopping portion so as to fasten the second stopping portion.

According to the above aspect of the present invention, since the control terminal includes the protrusion portion and the L-shaped member, the protrusion portion and the L-shaped member of the control terminal are in contact with the front surface and the rear surface of the cover, respectively, so that the control terminal is fixed. Therefore, at the time of detaching the connector, a stress exerted on the control terminal is not transferred to the insulating substrate through the control terminal. Accordingly, at the time of detaching the connector, it is possible to prevent a decrease in dielectric strength due to fracture of the insulating substrate and to prevent displacement of the control terminal and damage to the solder attaching the control terminal and the insulating substrate due to depression of the insulating substrate.

In addition, according to the above aspect of the present invention, since the two protrusion portions interposing the cover of the resin case are installed in the portion of the control terminal which penetrates the case, the two protrusion portions are in contact with the front surface and the rear surface of the cover of the case, respectively, so that the control terminal is fixed. Therefore, at the time of detaching the connector, a stress exerted on the control terminal is not transferred to the insulating substrate through the control terminal. Accordingly, at the time of detaching the connector, it is possible to prevent a decrease in dielectric strength due to fracture of the insulating substrate and to prevent displacement of the control terminal and damage to the solder attaching the control terminal and the insulating substrate due to depression of the insulating substrate.

In addition, according to the above aspect of the present invention, since the notch portion is installed in the portion of the control terminal which penetrates the case, the upper sidewall and the lower sidewall of the notch portion are in contact with the front surface and the rear surface of the cover of the case, respectively, so that the control terminal is fixed. Therefore, at the time of detaching the connector, a stress exerted on the control terminal is not transferred to the insulating substrate through the control terminal. Accordingly, at the time of detaching the connector, it is possible to prevent a decrease in dielectric strength due to fracture of the insulating substrate and to prevent displacement of the control terminal and damage to the solder attaching the control terminal and the insulating substrate due to depression of the insulating substrate.

According to a semiconductor device of the present invention, it is possible to obtain an effect capable of providing a semiconductor device having high dielectric strength. In addition, according to a semiconductor device of the present invention, it is possible to obtain an effect capable of providing a semiconductor device having high reliability.

DETAILED DESCRIPTION

Figure 1:
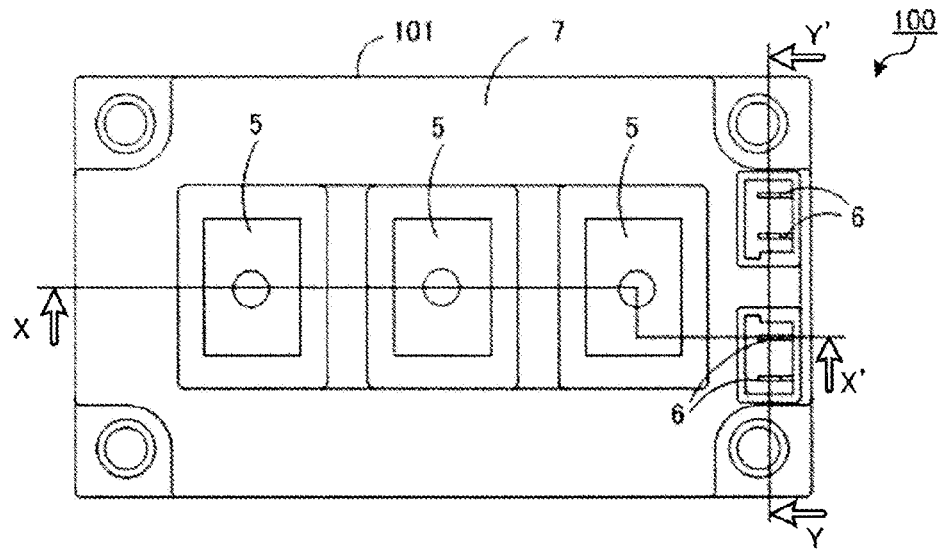
FIG. 1 (which includes FIGS. 1(a)-1(d)) is a diagram for describing a semiconductor device according to a first embodiment of the present invention.
Figure 1:
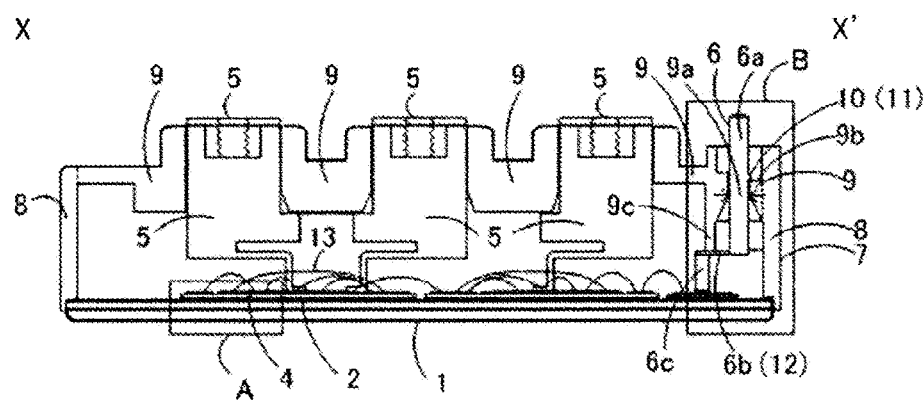
Figure 1:
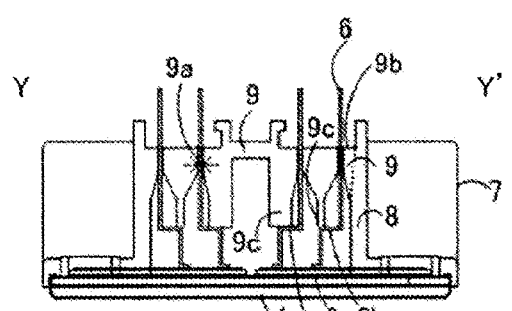
Figure 1:
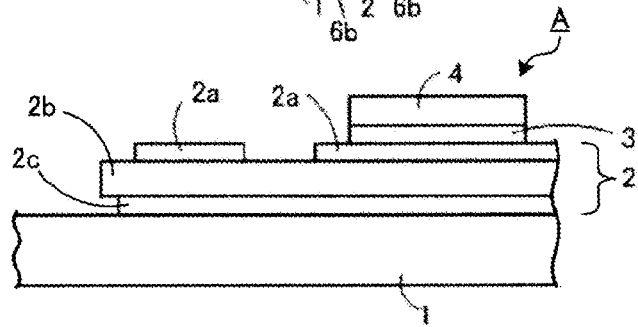

Hereinafter, exemplary embodiments of a semiconductor device according to the present invention will be described in detail with reference to the attached drawings. In addition, in the descriptions and the attached drawings according to the following embodiment, the same elements are denoted by the same reference numerals, and the description thereof will not be repeated.

First Embodiment

FIG. 1 is a diagram for describing a semiconductor device according to a first embodiment of the present invention. FIG. 1(a) illustrates a plan diagram of main components of a package 101 of a power module 100. FIG. 1(b) illustrates a cross-sectional diagram taken along line X-X' in FIG. 1(a). FIG. 1(c) illustrates a cross-sectional diagram taken along line Y-Y' in FIG. 1(a). FIGS. 1(b) and 1(c) illustrate the power module 100 seen in the direction of a white arrow illustrated in the vicinity of the cut line in FIG. 1(a). FIG. 1(d) illustrates enlargement of a vicinity A of an insulating substrate 2 of FIG. 1(b).

Figure 2:
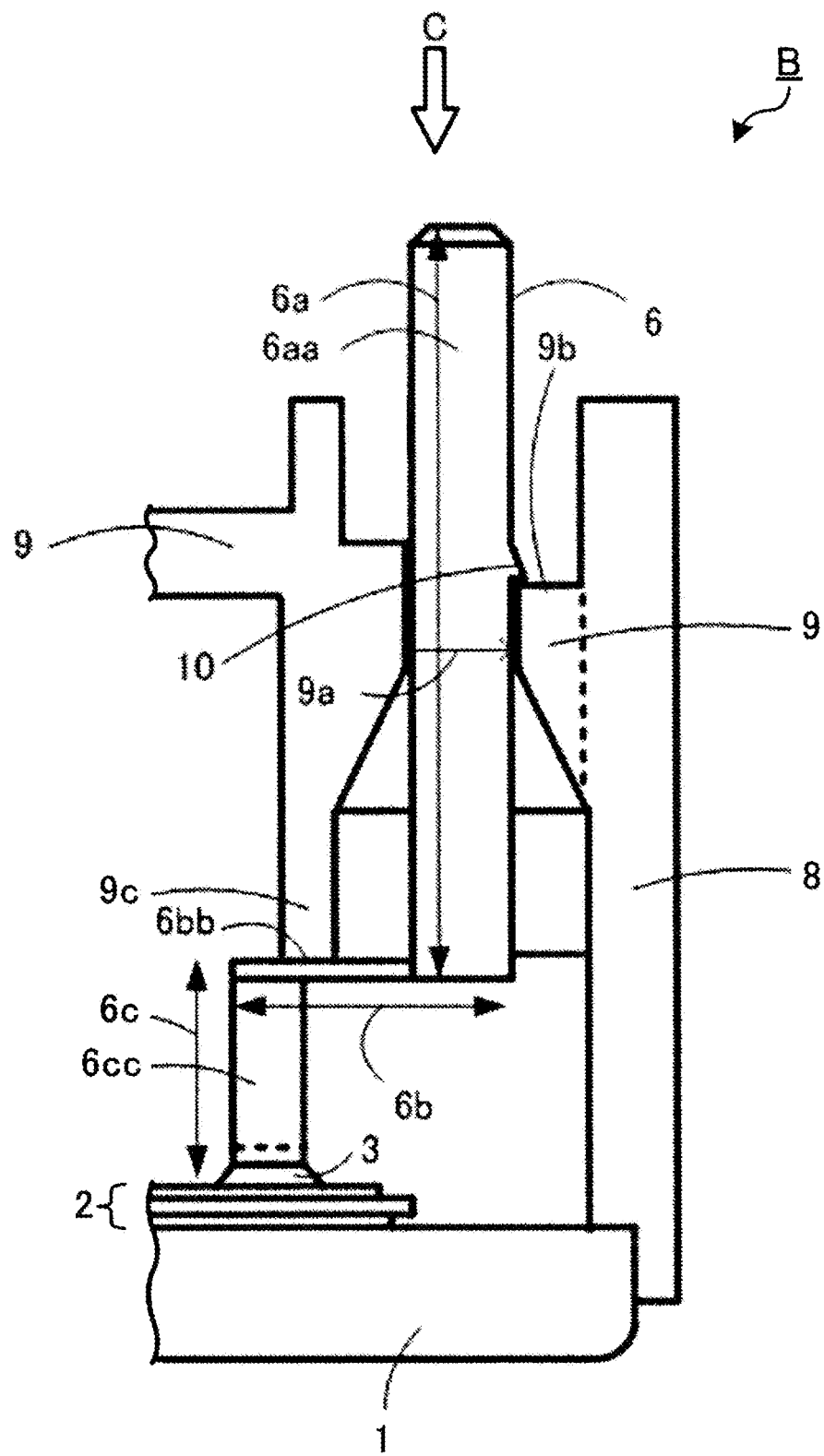
FIG. 2 is a cross-sectional diagram illustrating main components of the semiconductor device illustrated in FIG. 1.
Figure 3:
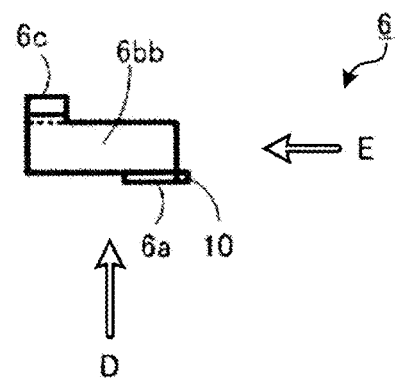
FIG. 3 (which includes FIGS. 3(a)-3(c)) is a diagram for describing main components of the semiconductor device illustrated in FIG. 1.
Figure 3:
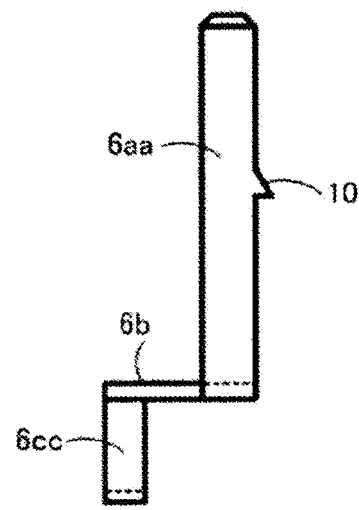
Figure 3:
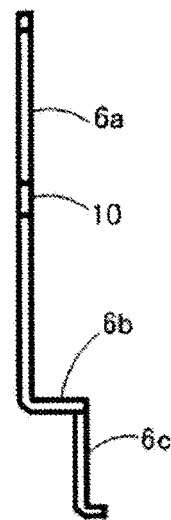

In addition, FIG. 2 is a cross-sectional diagram illustrating main components of the semiconductor device illustrated in FIG. 1. In addition, FIG. 3 is a diagram for describing main components of the semiconductor device illustrated in FIG. 1. FIG. 2 illustrates enlargement of a vicinity B of a control terminal 6 of the power module 100 illustrated in FIG. 1. FIG. 3 illustrates a configuration of the control terminal 6 in detail. FIG. 3(a) is a plan diagram of the control terminal 6 illustrated in FIG. 2 as seen at the opened side of a resin case 7 (as seen in the direction indicated by a white downward arrow C). FIG. 3(b) is a cross-sectional diagram of the control terminal 6 illustrated in FIG. 3(a) as seen at the side of a side surface where a protrusion portion 10 is not installed (as seen in the direction indicated by a white upward arrow D). FIG. 3(c) is a cross-sectional diagram of the control terminal 6 illustrated in FIG. 3(a) as seen at the side of a side surface where the protrusion portion 10 is installed (as seen in the direction indicated by a white leftward arrow E).

Figure 4:
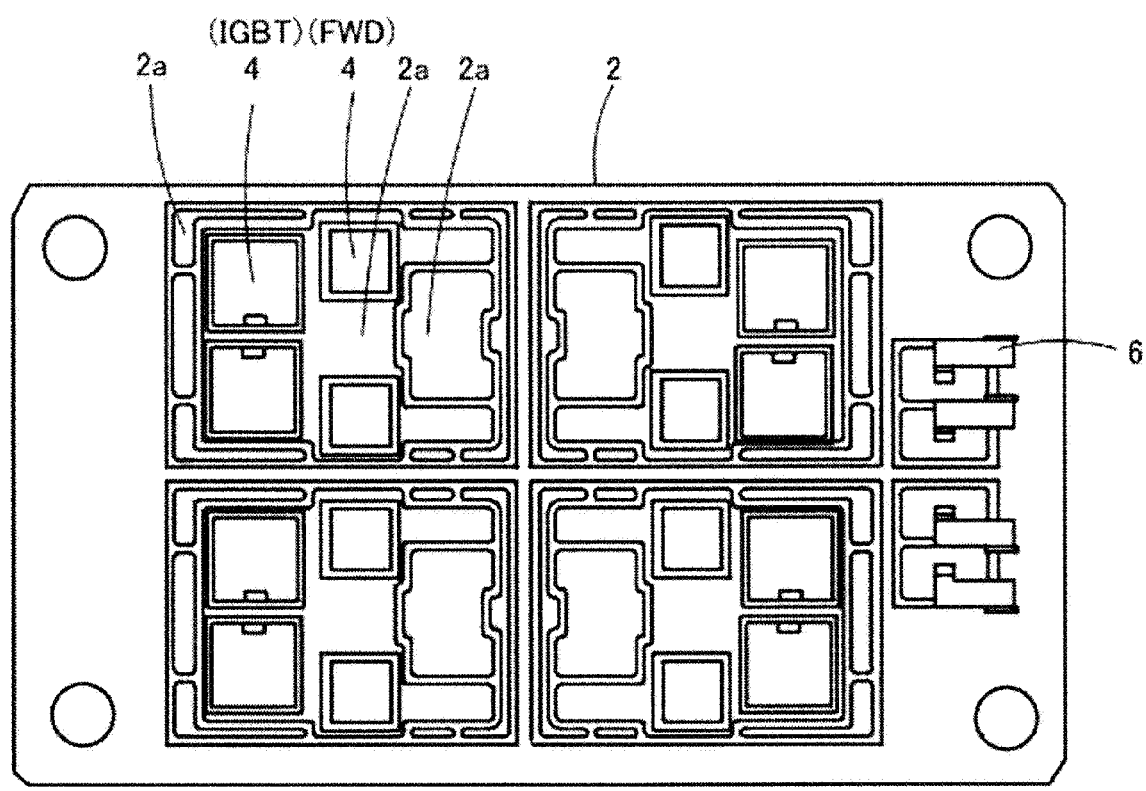
FIG. 4 is a plan diagram illustrating the semiconductor device according to the first embodiment of the present invention.

FIG. 4 is a plan diagram illustrating the semiconductor device according to the first embodiment of the present invention. FIG. 4 illustrates the power module 100 where a plurality of semiconductor chips 4 and a plurality of control terminals 6 are attached to the circuit pattern 2a of the insulating substrate 2 through solder 3. The semiconductor chip 4 is, for example, an IGBT (Insulated Gate Bipolar Transistor) chip, an FWD (Free Wheeling Diode) chip, or the like. As illustrated in FIGS. 1 to 4, the power module 100 where a plurality of semiconductor chips 4 are integrated in the same package 101 is employed as an example of the semiconductor device according to the first embodiment, and a configuration of the semiconductor device according to the first embodiment is described.

The package 101 of the power module 100 is configured to include a metal base (metal member) 1, an insulating substrate 2 which is attached to the metal base 1, a main terminal 5 and a control terminal 6 which are attached to a circuit pattern 2a of the insulating substrate 2, and a resin case 7 which is adhered to a circumference of the metal base 1. In the power module 100, a plurality of the semiconductor chips 4 such as IGBT or FWD are mounted to the circuit pattern 2a of the insulating substrate 2 of the package 101.

In the insulating substrate 2, the circuit pattern 2a is installed on the front-surface side of an insulating layer 2b, and a rear copper foil 2c is installed on the rear-surface side thereof. The front surface of the metal base 1 is attached to the rear copper foil 2c of the insulating substrate 2 through solder (not illustrated). The rear surface of the semiconductor chip 4, one end of the main terminal 5, and one end of the control terminal 6 are attached to the circuit pattern 2a of the insulating substrate 2 through the solder 3.

Electrodes (not illustrated) of semiconductor elements and the circuit patterns 2a installed on the front surface of the semiconductor chip 4 are electrically connected to each other through bonding wires 13 such as aluminum wires, and the circuit patterns 2a are electrically connected to each other through the bonding wires 13 such as aluminum wires. The resin case 7 is adhered to a circumference of the metal base 1. The resin case 7 is configured so that a sidewall 8 and a cover 9 are integrally formed, and an end of the sidewall 8 of the resin case 7 is adhered to the circumference of the metal base 1. The end of the main terminal 5 and the end of the control terminal 6 opposite to the ends of the main terminal 5 and the control terminal 6 which are attached to the circuit pattern 2a penetrate the cover 9 of the resin case 7 to be exposed to the outer side of the resin case 7.

Next, a configuration of a vicinity B of the control terminal 6 of the power module 100 will be described in detail. The control terminal 6 is configured to include a penetration portion 6a which penetrates the cover 9 of the resin case 7, an L-shaped processed portion (L-shaped member) 6b which is connected to the penetration portion 6a and is installed to be substantially rectangular to the penetration portion 6a to constitute an L-shaped shape together with the penetration portion 6a, and a connection portion 6c of which the one end is connected to a bottom surface portion of the L-shaped processed portion 6b and of which the other end is adhered to the insulating substrate 2 through the solder 3. The other end of the connection portion 6c is perpendicularly bent, and the perpendicularly-bent end of the connection portion 6c is attached to the insulating substrate 2 through the solder 3.

The L-shaped cross section of the L-shaped processed portion 6b is formed with a protrusion portion configured with the penetration portion 6a and the bottom surface portion. Therefore, a side surface 6bb of the bottom surface portion of the L-shaped processed portion 6b is substantially rectangular to a side surface 6aa of the penetration portion 6a. The side surface 6cc of the connection portion 6c is substantially perpendicular to the bottom surface portion of the L-shaped processed portion 6b at the side surface 6bb of the side of the bottom surface portion of the L-shaped processed portion 6b opposite to the side surface 6bb of the side of the bottom surface portion of the L-shaped processed portion 6b, which is connected to the penetration portion 6a, and is substantially parallel to the side surface 6aa of the penetration portion 6a. The side surface 6aa of the penetration portion 6a is a flat plane except for the portion where the protrusion portion 10 is installed. The bottom surface portion of the L-shaped processed portion 6b and the side surfaces 6bb and 6cc of the connection portion 6c are flat planes.

A penetration hole 9a which penetrates the control terminal 6 is installed in the cover 9 of the resin case 7. In addition, a protrusion portion (hook) 10 is installed as a portion of the control terminal 6, which passes through the penetration hole 9a. More specifically, after the completion of assembly of the power module 100, a protrusion portion 10 is installed in the portion of the penetration portion 6a of the control terminal 6, which is exposed to the outer side of the resin case 7. The protrusion portion 10 is installed, for example, in the side surface of the penetration portion 6a, which faces the sidewall 8 of the resin case 7, so as to be in contact with the front surface of the cover 9 of the resin case 7.

The protrusion portion 10 of the control terminal 6 is a first stopping portion 11 which prevents the control terminal 6 from moving in the direction facing the insulating substrate 2. More specifically, the protrusion portion 10 is in contact with the front surface of the cover 9 of the resin case 7, so that the control terminal 6 is prevented from moving in the direction pressing the insulating substrate 2, for example, at the time of attaching the connector to the penetration portion 6a of the control terminal 6. The bottom surface portion of the L-shaped processed portion 6b of the control terminal 6 is a second stopping portion 12 which prevents the control terminal 6 from moving in the direction being separated from the insulating substrate 2. More specifically, the bottom surface portion of the L-shaped processed portion 6b is in contact with the rear surface of the cover 9 of the resin case 7, so that the control terminal 6 is prevented from being extracted outwards from the resin case 7, for example, at the time of attaching the connector to the penetration portion 6a of the control terminal 6.

Next, the configuration of the cover 9 of the resin case 7 which the protrusion portion 10 of the control terminal 6 and the bottom surface portion of the L-shaped processed portion 6b of the control terminal 6 are in contact with will be described in detail. A protrusion receiving portion 9b which is in contact with the protrusion portion 10 of the control terminal 6 is installed in the front-surface side of the cover 9 of the resin case 7. More specifically, the protrusion receiving portion 9b is configured as a member including the sidewall of the penetration hole 9a of the resin case 7 and the front surface of the cover 9 so that the protrusion receiving portion 9b is in contact with the side surface 6aa of the penetration portion 6a by using the sidewall of the penetration hole 9a and is in contact with the protrusion portion 10 by using the front surface of the cover 9.

The protrusion receiving portion 9b is a first fastening portion which is configured to include the sidewall of the penetration hole 9a and the surface directing the side opposite to the metal base 1 to fasten (fix) the first stopping portion 11 to the surface directing the side opposite to the metal base 1. More specifically, the protrusion receiving portion 9b is configured with a portion of the cover 9 remaining in the sidewall 8 side of the resin case 7 when the penetration hole 9a is installed in the cover 9 of the resin case 7. The protrusion portion 10 is in contact with the upper surface of the protrusion receiving portion 9b, that is, the front surface of the cover 9 of the resin case 7, so that the control terminal 6 is fastened A convex portion 9c which is in contact with the bottom surface portion of the L-shaped processed portion 6b of the control terminal 6 is installed in the rear-surface side of the cover 9 of the resin case 7. The convex portion 9c protrudes from the rear side of the cover 9 to the insulating substrate 2 side. The surface of the convex portion 9c, which faces the insulating substrate 2, is in contact with the side surface 6bb of the bottom surface portion of the L-shaped processed portion 6b, so that the control terminal 6 is fastened.

The convex portion 9c is a second fastening portion which is configured to include the sidewall of the penetration hole 9a, which faces the sidewall constituting the protrusion receiving portion 9b, and the surface which directs the metal base 1 side to fasten the second stopping portion 12 by using the surface directing the metal base 1 side. More specifically, the convex portion 9c is installed at the position of the rear surface of the cover 9 of the resin case 7, which corresponds to the side surface 6bb of the bottom surface portion of the L-shaped processed portion 6b, so as to protrude to the metal base 1 side at such a height that the control terminal 6 is in contact with the bottom surface portion of the L-shaped processed portion 6b. The bottom surface portion of the L-shaped processed portion 6b is in contact with the surface of the convex portion 9c, which faces the metal base 1, so that the control terminal 6 is fastened.

Figure 5:
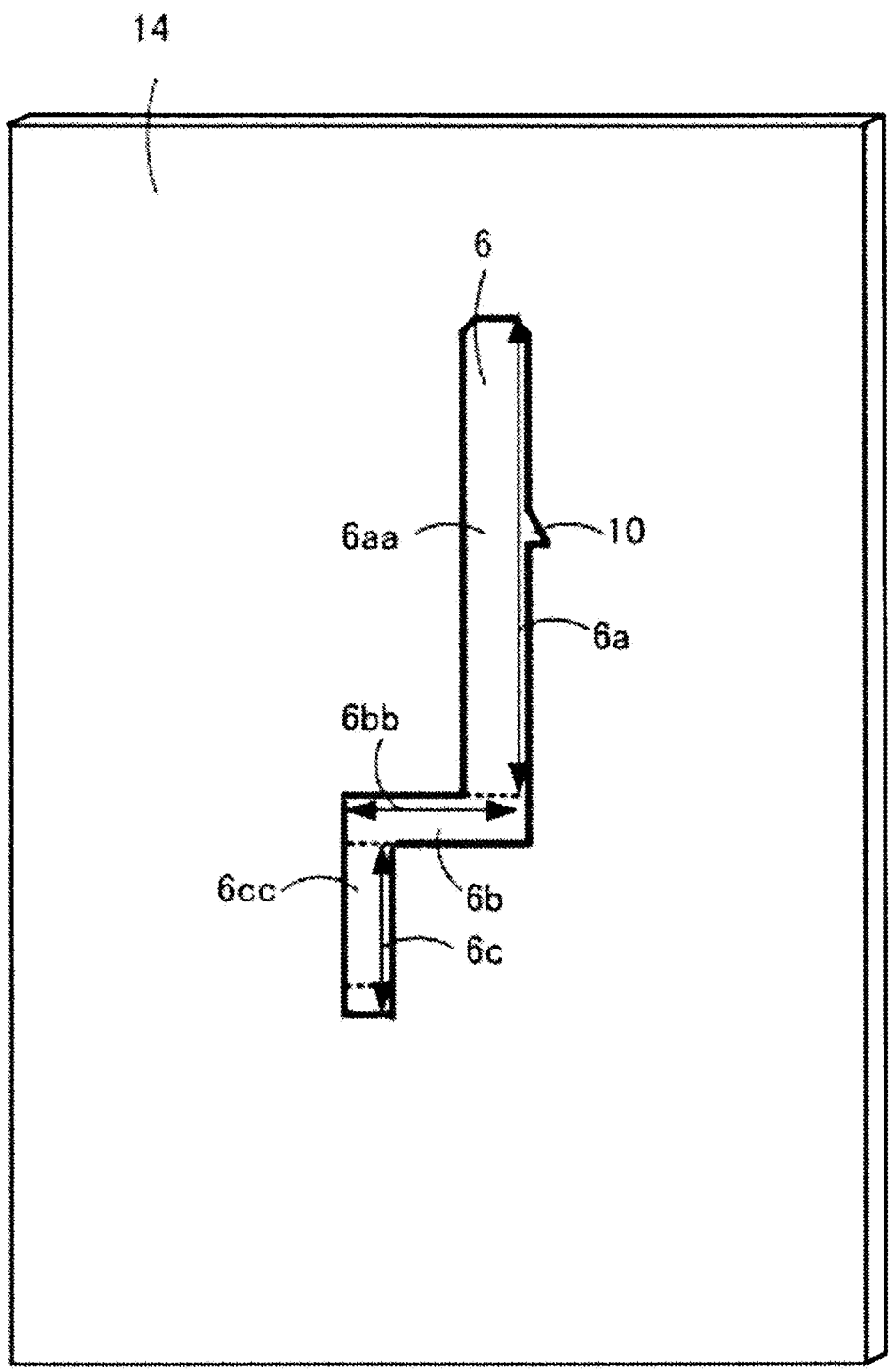
FIG. 5 is a cross-sectional diagram illustrating main components of the semiconductor device according to the first embodiment during manufacturing thereof.

The control terminal 6 and the resin case 7 are individual components which are independent of each other. FIG. 5 is a cross-sectional diagram illustrating main components of the semiconductor device according to the first embodiment during manufacturing thereof. FIG. 5 illustrates the control terminal 6 during manufacturing thereof. As illustrated in FIG. 5, the control terminal 6 is a component obtained by forming a sequence of the penetration portion 6a, the L-shaped processed portion 6b, and the connection portion 6c as one component and is formed by cutting out from one sheet of the metal plate 14.

The portion that becomes the side surface 6bb of the bottom surface portion of the L-shaped processed portion 6b is formed by bending the metal plate 14 to be substantially perpendicular to the side surface 6aa of the penetration portion 6a. The portion that becomes the side surface 6cc of the connection portion 6c is formed by bending the metal plate 14 at the side opposite to the penetration portion 6a to be substantially perpendicular to the side surface 6bb of the bottom surface portion of the L-shaped processed portion 6b and to be substantially parallel to the side surface 6aa of the penetration portion 6a. The protrusion portion 10 is formed at the position where the penetration portion 6a penetrates the cover 9 of the resin case 7. The control terminal 6 having the above-described cross-sectional shape is formed, so that the L-shaped processed portion 6b is bent by a stress exerted on the penetration portion 6a (spring effect). Therefore, when a stress is exerted on the penetration portion 6a, the L-shaped processed portion 6b is bent, so that it is possible to reduce damage to the solder 3.

Figure 6:
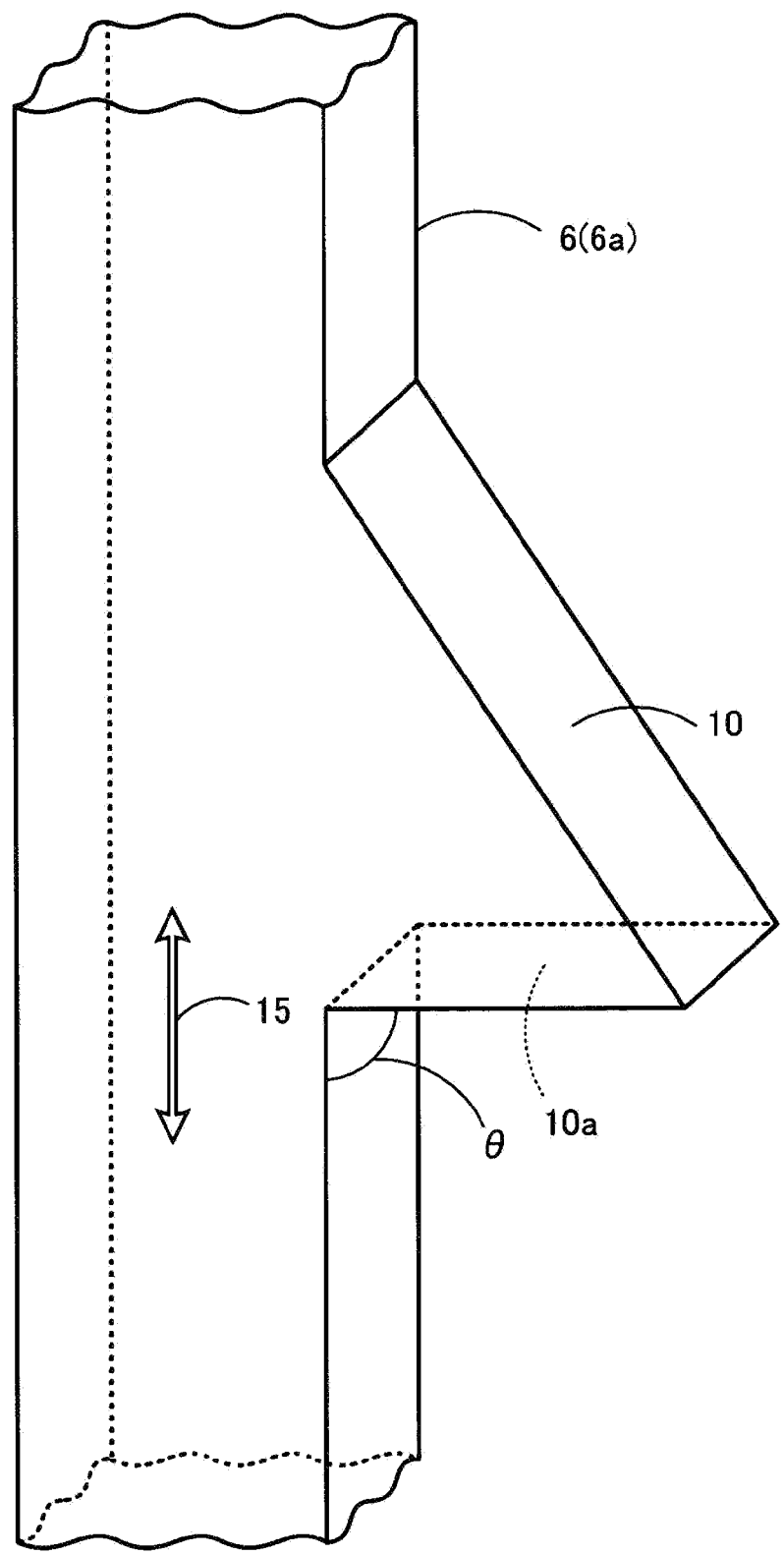
FIG. 6 is a perspective diagram illustrating main components of the semiconductor device according to the first embodiment.

Next, the protrusion portion 10 of the control terminal 6 will be described in detail. FIG. 6 is a perspective diagram illustrating main components of the semiconductor device according to the first embodiment. FIG. 6 illustrates a three-dimensional shape of the protrusion portion 10 installed in the penetration portion 6a of the control terminal 6 of the power module 100. The cross-sectional shape of the protrusion portion 10 formed in the control terminal 6 has a triangular shape which is narrow at the upper side of the control terminal 6 and is widened toward the lower side. The angle θ between the lower end surface 10a of the protrusion portion 10 and the longitudinal direction 15 of the control terminal 6 is in a range of from about 60° to about 90°. If the angle θ between the lower end surface 10a of the protrusion portion 10 and the longitudinal direction 15 of the control terminal 6 is an acute angle, the protrusion portion 10 is in a state that the penetration portion 6a protrudes and pierces into the resin case 7, so that a degree of contact between the lower end surface 10a of the protrusion portion 10 and the protrusion receiving portion 9b is improved.

The above-described power module 100 including the control terminal 6 and the resin case 7 can be assembled as follows. First, by using a well-known method, the insulating substrate 2, the semiconductor chip 4, the control terminal 6, and the like are attached to the front surface of the metal base 1. Next, the penetration portion 6a of the control terminal 6 is inserted into the penetration hole 9a from the rear-surface side of the cover 9 along the sidewall of the penetration hole 9a formed in the cover 9. At this time, the penetration portion 6a is inserted until the protrusion portion 10 installed in the penetration portion 6a penetrates the penetration hole 9a.

Next, the control terminal 6 is arranged so that the lower end surface 10a of the protrusion portion 10 is in contact with the front surface of the cover 9, that is, the upper surface of the protrusion receiving portion 9b, so that the side surface (upper surface) 6bb of the bottom surface portion of the L-shaped processed portion 6b of the control terminal 6 is in contact with the convex portion 9c formed in the rear-surface side of the cover 9. Next, the circumference of the metal base 1 and the lower end of the resin case 7 are allowed to be aligned with each other, and the circumference of the metal base 1 and the lower end of the resin case 7 are adhered to each other by using an adhesive material. Therefore, the assembly of the power module 100 is completed.

Figure 7:
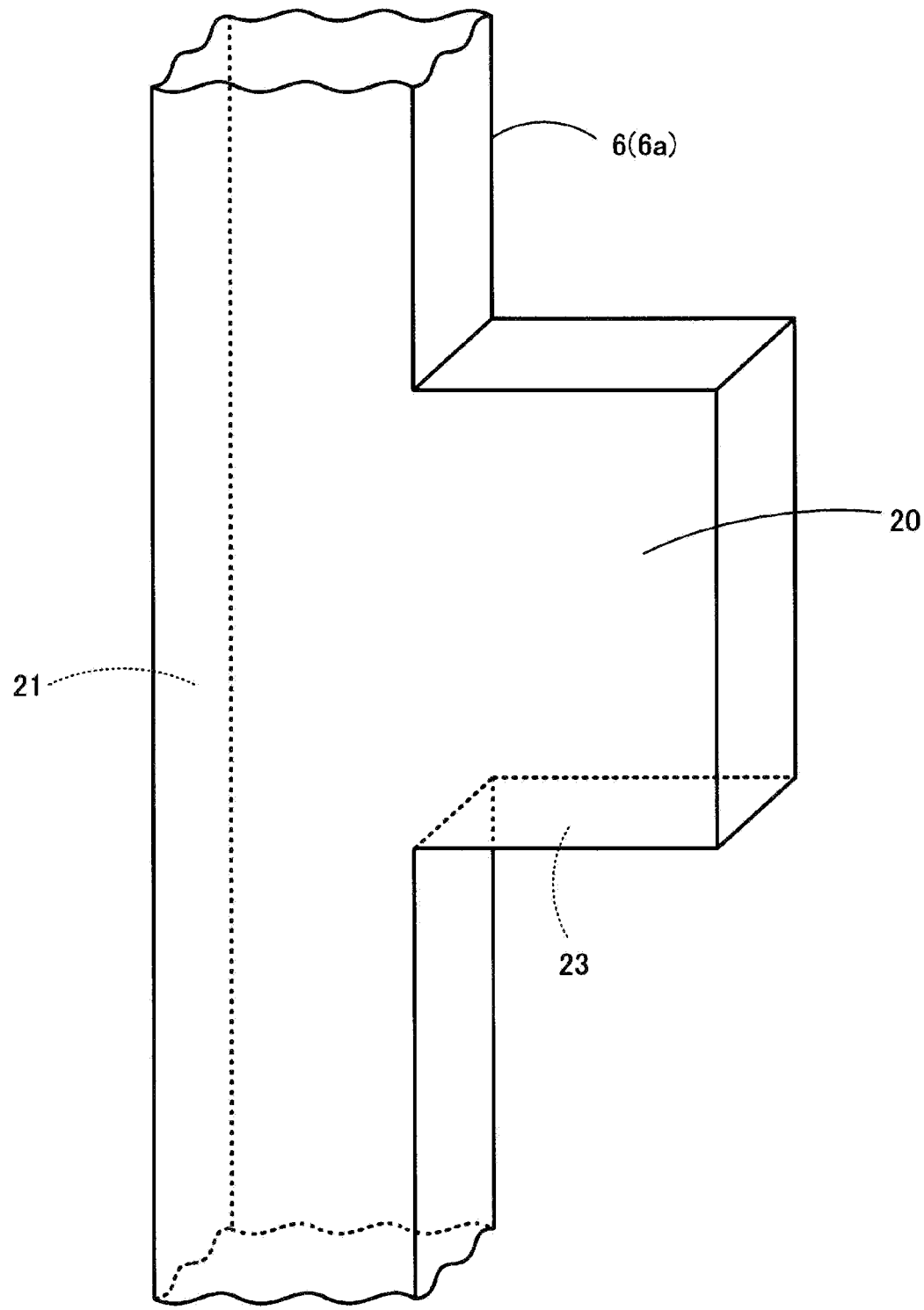
FIG. 7 is a perspective diagram illustrating another example of the main components of the semiconductor device according to the first embodiment.
Figure 8:
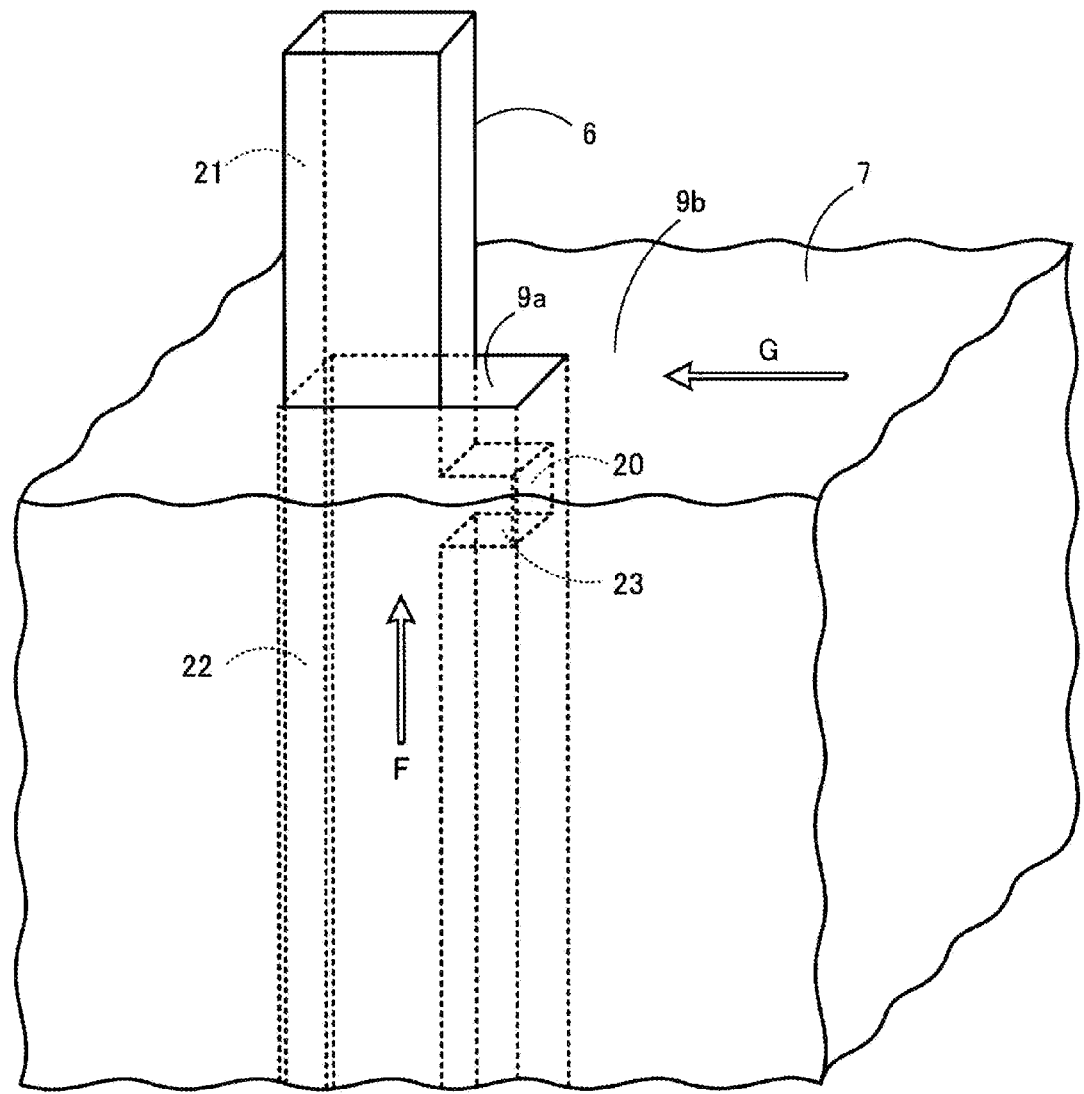
FIG. 8 is a perspective diagram illustrating the main components of the semiconductor device illustrated in FIG. 7 during assembling thereof.

FIG. 7 is a perspective diagram illustrating another example of the main components of the semiconductor device according to the first embodiment. As illustrated in FIG. 7, a cross-sectional shape of the protrusion portion 20 may also be rectangular. In other words, the protrusion portion 20 may also be a rectangular pillar. Other configurations of the control terminal 6 except for the protrusion portion 20 illustrated in FIG. 7 are the same as those of the control terminal 6 illustrated in FIG. 6. In the case of using the control terminal 6, the power module 100 can be assembled as follows. FIG. 8 is a perspective diagram illustrating the main components of the semiconductor device illustrated in FIG. 7 during assembling thereof. FIG. 8 illustrates a state where a protrusion portion 20 of the control terminal 6 is passing through the penetration hole 9a.

First, as illustrated in FIG. 8, the side surface 21 of the control terminal 6, which is opposite to the side surface where the protrusion portion 20 of the control terminal 6 is installed, is pushed on the sidewall 22 of the penetration hole 9a which is in the convex portion 9c side, and the control terminal 6 is inserted into the penetration hole 9a in the direction (white upward arrow) F directing from the rear-surface side of the cover 9 toward the front-surface side so as to cover the resin case 7 to the control terminal 6. The resin case 7 is moved in the direction (white leftward arrow) G parallel to the front surface of the cover 9 so as to allow the lower end surface 23 of the protrusion portion 20 to be in contact with the protrusion receiving portion 9b after the protrusion portion 20 penetrates the penetration hole 9a. Next, the circumference of the metal base 1 and the lower end of the resin case 7 are allowed to be aligned with each other, and the circumference of the metal base 1 and the lower end of the resin case 7 are adhered to each other by using an adhesive material. Therefore, the assembly of the power module 100 is completed.

In addition, in the case of using the control terminal 6 having the rectangular-pillar-shaped protrusion portion 20 illustrated in FIG. 7, the power module 100 can be assembled as follows. First, by using the spring effect of the control terminal 6, the side surface 21 of the control terminal 6, which is opposite to the side surface where the protrusion portion 20 of the control terminal 6 is installed, is pushed on the sidewall 22 of the penetration hole 9a which is in the convex portion 9c side, and the control terminal 6 is inserted into the penetration hole 9a in the direction F directing from the rear-surface side of the cover 9 toward the front-surface side. Next, at the time when the protrusion portion 20 penetrates the penetration hole 9a, the pushing on the sidewall 22 of the penetration hole 9a which is in the convex portion 9c side is stopped to release load to the L-shaped processed portion 6b of the control terminal 6, so that the spring effect is removed. Therefore, the protrusion portion 20 is allowed to be in contact with the protrusion receiving portion 9b.

Figure 9:
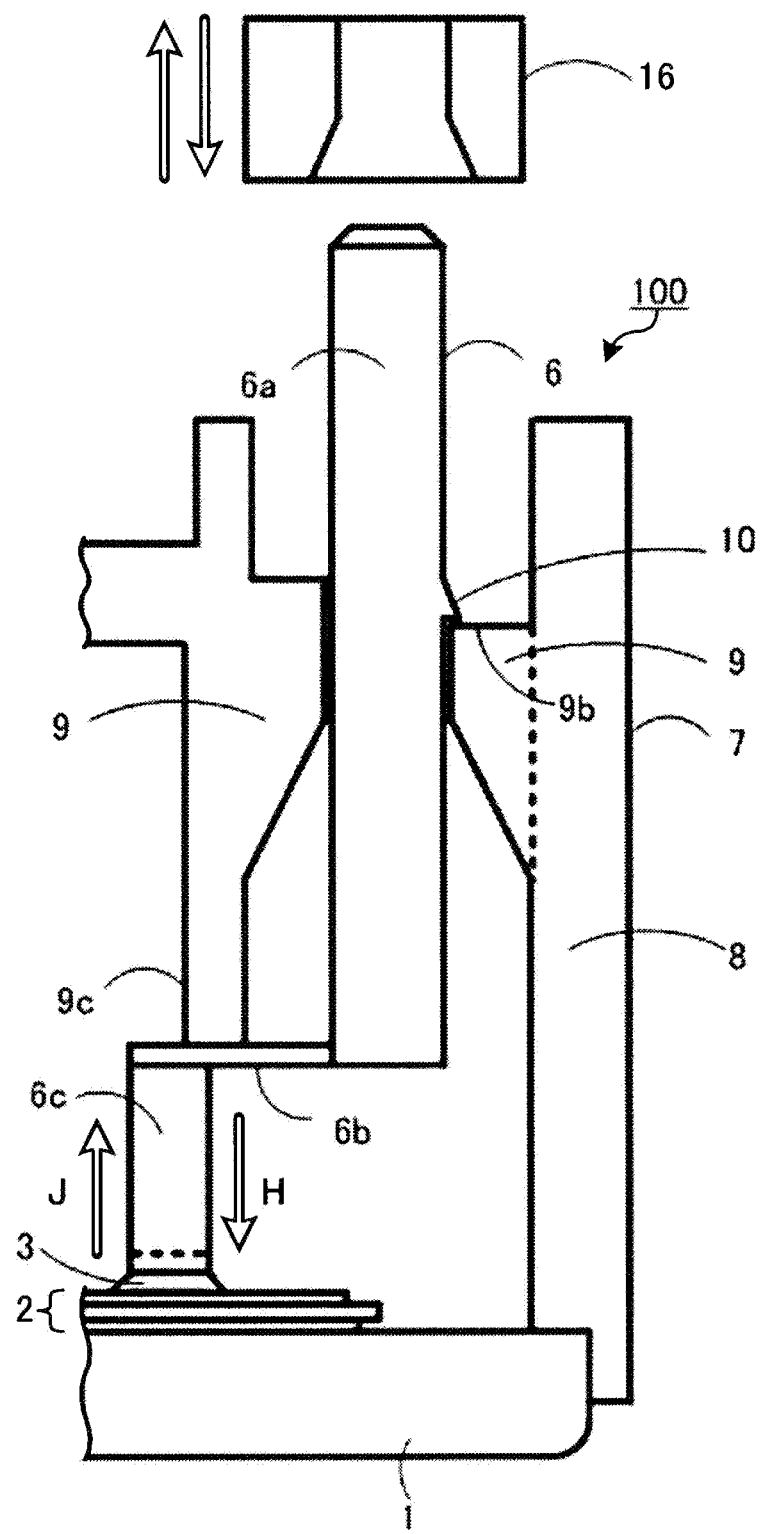
FIG. 9 is a cross-sectional diagram illustrating directions of forces exerted at the time of attachment/detachment of a connector of the semiconductor device illustrated in FIG. 1.

Next, directions of forces at the time of detaching the connector 16 from the control terminal 6 will be described. FIG. 9 is a cross-sectional diagram illustrating directions of forces exerted at the time of attachment/detachment of the connector of the semiconductor device illustrated in FIG. 1. In FIG. 9, the movement directions of the connector 16 are indicated by white arrows illustrated in the left side of the connector 16. The white downward arrow illustrated in the left side of the connector 16 is the movement direction of the connector 16 at the time of attaching the connector 16 to the control terminal 6. In addition, the white upward arrow illustrated in the left side of the connector 16 is the movement direction of the connector 16 at the time of detaching the connector 16 from the control terminal 6.

First, in the case of attaching the connector 16 to the control terminal 6, a stress of moving the control terminal 6 towards the insulating substrate 2 is exerted on the control terminal 6. In other words, a stress is exerted on the control terminal 6 in the direction (white downward arrow) H where a compression stress is exerted on the insulating substrate 2. At this time, the protrusion portion 10 of the control terminal 6 is in contact with the protrusion receiving portion 9b of the cover 9, so that the movement of the control terminal 6 is stopped. On the other hand, in the case of detaching the connector 16 from the control terminal 6, a stress of moving the control terminal 6 in the direction (white upward arrow) J where the control terminal 6 is separated from the insulating substrate 2 is exerted on the control terminal 6. At this time, the bottom surface portion of the L-shaped processed portion 6b of the control terminal 6 is in contact with the convex portion 9c of the rear surface of the cover 9, so that the movement of the control terminal 6 is stopped. Therefore, the control terminal 6 is fastened by allowing the protrusion portion 10 to be hooked by the protrusion receiving portion 9b of the cover 9 and allowing the bottom surface portion of the L-shaped processed portion 6b to be hooked by the convex portion 9c of the cover 9.

In this manner, at the time of detaching the connector 16, the protrusion receiving portion 9b and the convex portion 9c receives the stress exerted on the control terminal 6, so that the control terminal 6 is not moved. Therefore, the stress exerted on the control terminal 6 is not transferred to the insulating substrate 2 through the solder 3. Accordingly, at the time of detaching the connector 16, the stress exerted on the insulating substrate 2 is suppressed, so that fracture of the insulating substrate 2 or depression (displacement) of the control terminal 6 does not occur. As a result, a decrease in dielectric strength of the insulating substrate 2 or damage to the solder 3 is prevented, so that it is possible to provide a power module 100 having high reliability.

In addition, it is preferable that the sidewall of the penetration hole 9a which is in the protrusion receiving portion 9b side have a shape by which the sidewall is in contact with the penetration portion 6a to support the penetration portion 6a. The shape by which the sidewall is in contact with the penetration portion 6a to support the penetration portion 6a is, for example, a shape which the sidewall supports the penetration portion 6a at a position which is closer to the insulating substrate 2 than the protrusion receiving portion 9b. The sidewall of the penetration hole 9a which is in the protrusion receiving portion 9b side has the shape where the sidewall is in contact with the penetration portion 6a to the support the penetration portion 6a, so that a force in the rotational direction with respect to the protrusion receiving portion 9b as a supporting point is not exerted on the control terminal 6. Therefore, it is possible to provide a power module 100 having higher reliability.

As described hereinbefore, in the semiconductor device according to the first embodiment, since the control terminal 6 includes the protrusion portion 10 and the L-shaped member 6b, the protrusion portion 10 and the L-shaped member 6b of the control terminal 6 are in contact with the protrusion receiving portion 9b and the convex portion 9c of the cover 9, so that the control terminal 6 is fixed. Therefore, at the time of detaching the connector 16, the stress exerted on the control terminal 6 is not transferred to the insulating substrate 2 through the control terminal 6. Accordingly, at the time of detaching the connector 16, it is possible to prevent a decrease in dielectric strength due to fracture of the insulating substrate 2 and to prevent displacement of the control terminal 6 and damage to the solder 3 attaching the control terminal 6 and the insulating substrate 2 due to depression of the insulating substrate 2. Therefore, it is possible to provide a semiconductor device having high dielectric strength and high reliability.

Second Embodiment

Figure 10:
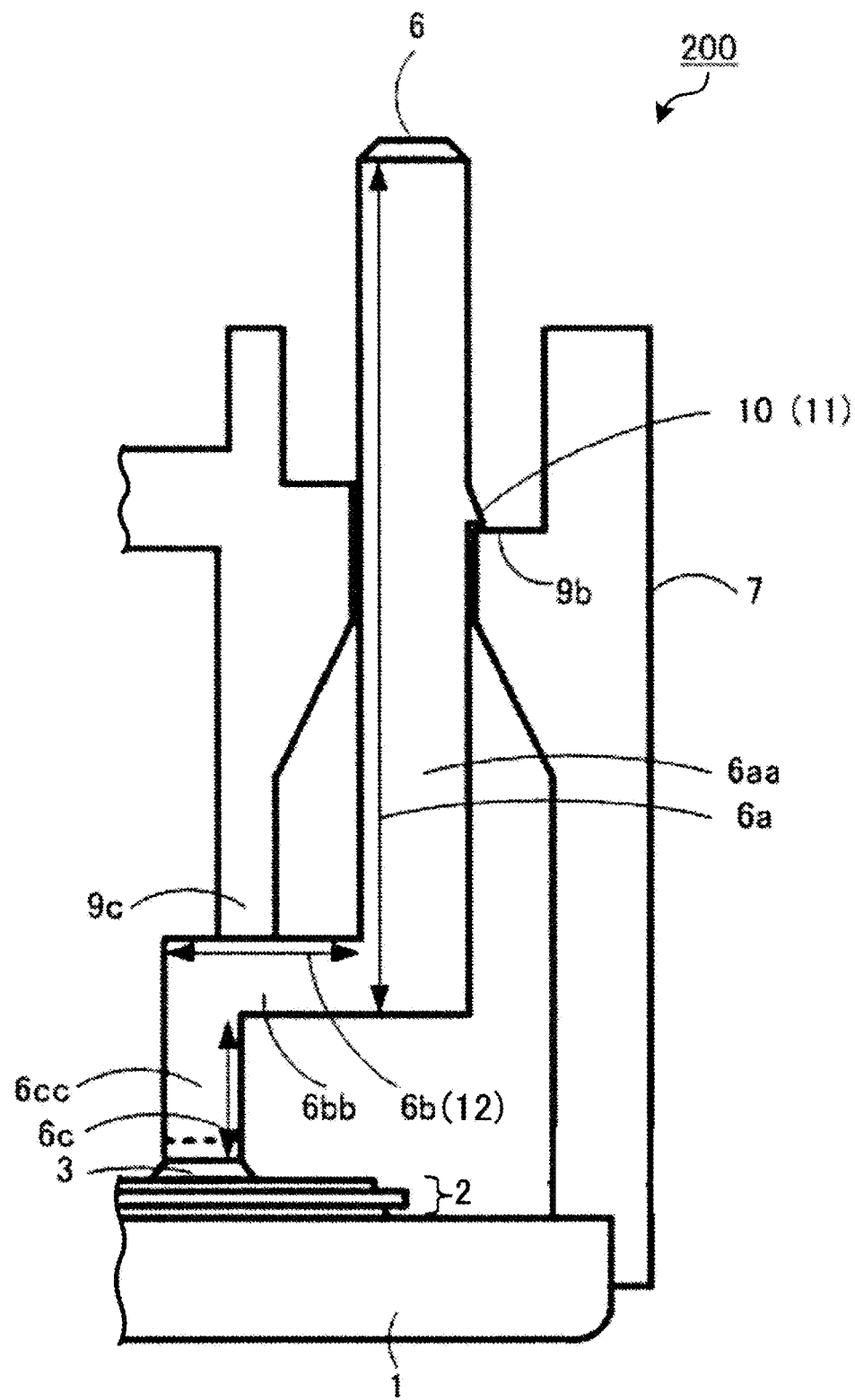
FIG. 10 is a cross-sectional diagram illustrating main components of a semiconductor device according to a second embodiment of the present invention.
Figure 11:
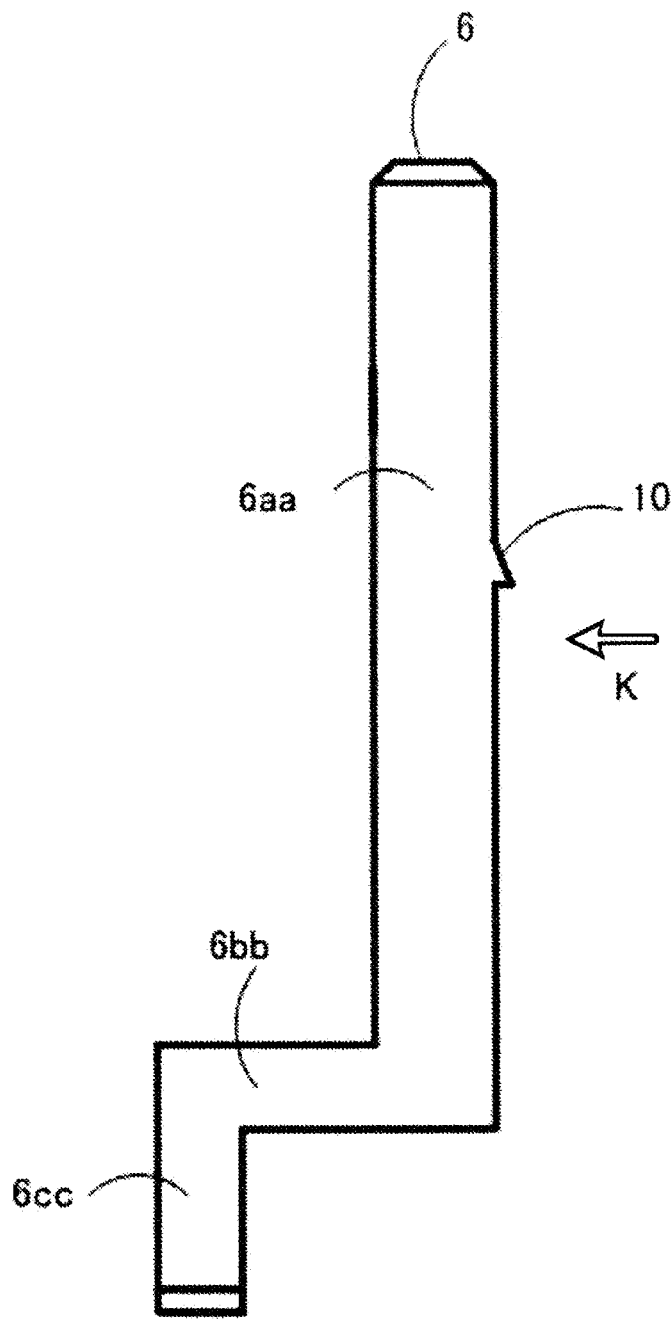
FIG. 11 (which includes FIGS. 11(a) and 11(b)) is a cross-sectional diagram illustrating main components of the semiconductor device illustrated in FIG. 10.
Figure 11:
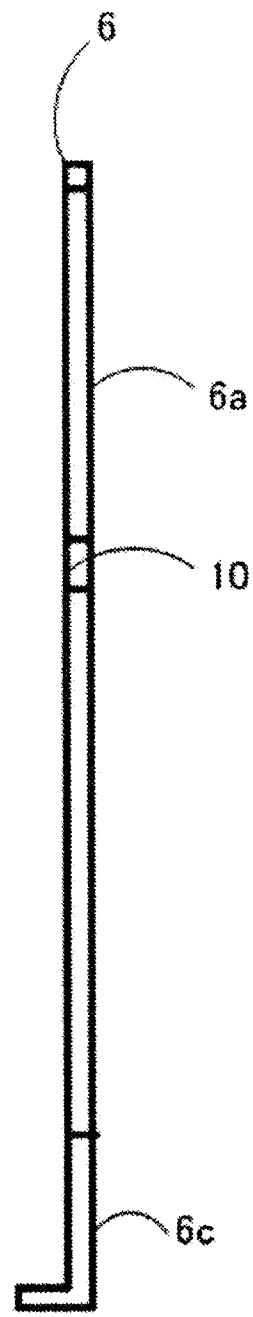

FIG. 10 is a cross-sectional diagram illustrating main components of a semiconductor device according to a second embodiment of the present invention. In addition, FIG. 11 is a cross-sectional diagram illustrating main components of the semiconductor device illustrated in FIG. 10. FIG. 10 illustrates a cross-sectional diagram of main components at the time of inserting the control terminal 6 constituting a power module 200 into the resin case 7. FIG. 11(a) is a cross-sectional diagram of the control terminal 6 constituting the package 101 of the power module 200 illustrated in FIG. 10 as seen from the side-surface side where the protrusion portion 10 is not installed. FIG. 11(b) is a cross-sectional diagram of the control terminal 6 illustrated in FIG. 11(a) as seen from the side-surface side where the protrusion portion 10 is installed (in the direction indicated by a white leftward arrow K)

The power module 200 according to the second embodiment is different from the power module according to the first embodiment in that the side surfaces 6aa, 6bb, and 6cc of the penetration portion 6a of the control terminal 6, the bottom surface portion of the L-shaped processed portion 6b, and the connection portion 6c are in the same plane. The configuration of the power module 200 according to the second embodiment is the same as that of the power module according to the first embodiment except for the connection position of the control terminal 6. In this case, since the side surface 6bb of the bottom surface portion of the L-shaped processed portion 6b and the side surface 6aa of the penetration portion 6a are in the same plane and are not bent, the solder 3 is easily damaged in comparison to the first embodiment where the bending (spring effect) of the L-shaped processed portion 6b is small.

However, similarly to the power module according to the first embodiment, in the case of detaching the connector (not illustrated), the protrusion portion 10 of the control terminal 6 and the bottom surface portion of the L-shaped processed portion 6b of the control terminal 6 are in contact with the protrusion receiving portion 9b and the convex portion 9c of the cover 9, respectively. Therefore, in the power module 200, a stress exerted on the control terminal 6 is not transferred to the insulating substrate 2 either. Accordingly, in the power module 200, the protrusion portion 10 becomes a first stopping portion 11, and the bottom surface portion of the L-shaped processed portion 6b becomes a second stopping portion 12.

As described hereinbefore, according to the second embodiment, it is possible to obtain the same effects as those of the semiconductor device according to the first embodiment.

Third Embodiment

Figure 12:
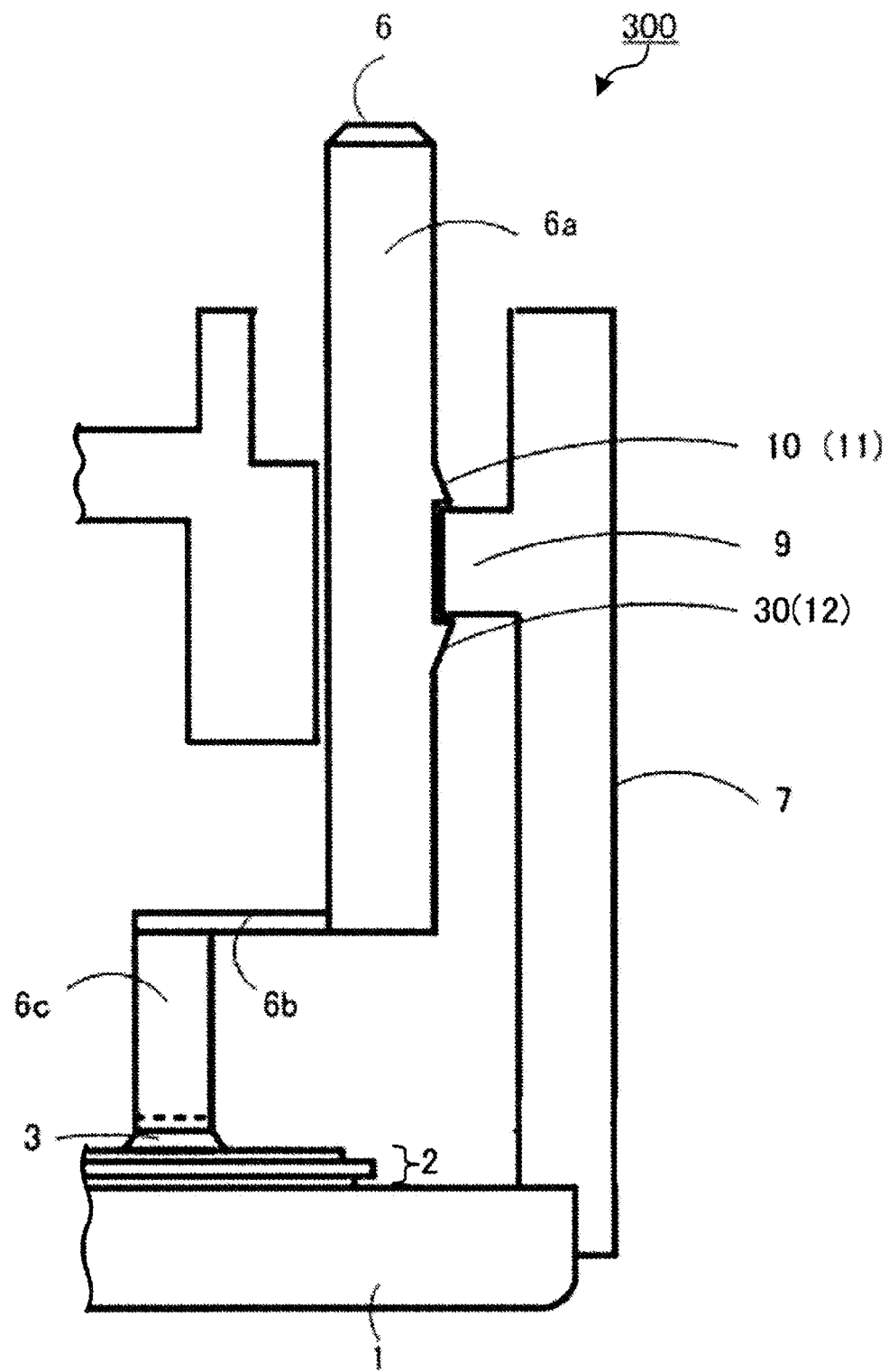
FIG. 12 is a cross-sectional diagram illustrating main components of a semiconductor device according to a third embodiment of the present invention.

FIG. 12 is a cross-sectional diagram illustrating main components of a semiconductor device according to a third embodiment of the present invention. FIG. 12 illustrates a cross-sectional diagram of main components at the time of inserting the control terminal 6 constituting a power module 300 into the resin case 7.

The power module 300 according to the third embodiment is different from the power module according to the first embodiment in that two protrusion portions (hereinafter, referred to as first and second protrusion portions) 10 and 30 are installed in the penetration portion 6a of the control terminal 6 to interpose the cover 9. The first protrusion portion 10 has the same configuration as that of the protrusion portion installed in the penetration portion 6a of the control terminal 6 of the power module according to the first embodiment. The second protrusion portion 30 is installed in the side surface where the first protrusion portion 10 of the control terminal 6 is installed.

In addition, for example, the second protrusion portion 30 is a symmetric portion of the first protrusion portion 10, and the second protrusion portion 30 has an inverted triangular cross-sectional shape which is narrow at the lower side of the control terminal 6 and is widened toward the upper side. In addition, the protrusion receiving portion 9b has a surface facing the metal base 1, and the second protrusion portion 30 is in contact with the surface of the protrusion receiving portion 9b, which faces the metal base 1. More specifically, the protrusion receiving portion 9b has a rectangular-pillar shape, and the second protrusion portion 30 is in contact with the lower end surface of the protrusion receiving portion 9b. In this manner, the second protrusion portion 30 is installed, so that at the time of detaching the connector from the control terminal 6, it is possible to prevent the control terminal 6 from being moved in the direction being separated from the metal base 1.

In this manner, in the power module 300, since the two protrusion portions of the first and second protrusion portions 10 and 30 are installed, at the time of detaching the connector (not illustrated), the movement of the control terminal 6 is stopped, so that transfer of a stress to the insulating substrate 2 through the control terminal 6 can be prevented. The configuration of the power module 300 according to the third embodiment is the same as that of the power module according to the first embodiment except for the protrusion portion 30.

Therefore, in the power module 300, among the two protrusion portions of the first and second protrusion portions 10 and 30, the first protrusion portion 10 formed in the front-surface side of the cover 9 becomes a first stopping portion 11, and the protrusion portion 30 formed in the rear-surface side of the cover 9 becomes a second stopping portion 12. In addition, the surface (front surface) of the cover 9, which directs the side opposite to the surface which directs the metal base 1 side, becomes a first fastening portion, and the surface of the cover 9, which directs the metal base 1 side, that is, the surface (rear surface) of the cover 9, which faces the front surface of the metal base 1, becomes a second fastening portion. In addition, in the power module 300, the L-shaped processed portion 6b of the control terminal 6 may not be installed. Therefore, similarly to the power module according to the second embodiment, the penetration portion 6a and the connection portion 6c of the control terminal 6 may be connected to each other so as to be aligned in a straight line.

As described hereinbefore, according to the semiconductor device of the third embodiment, since the two protrusion portions of the first and second protrusion portions 10 and 30 are installed in the penetration portion 6a of the control terminal 6 to interpose the cover 9 of the resin case 7, the two protrusion portions of the first and second protrusion portions 10 and 30 are in contact with the front surface and the rear surface of the cover 9 of the resin case 7, respectively, so that the control terminal 6 is fixed. Accordingly, it is possible to obtain the same effects as those of the semiconductor device according to the first embodiment.

Fourth Embodiment

Figure 13:
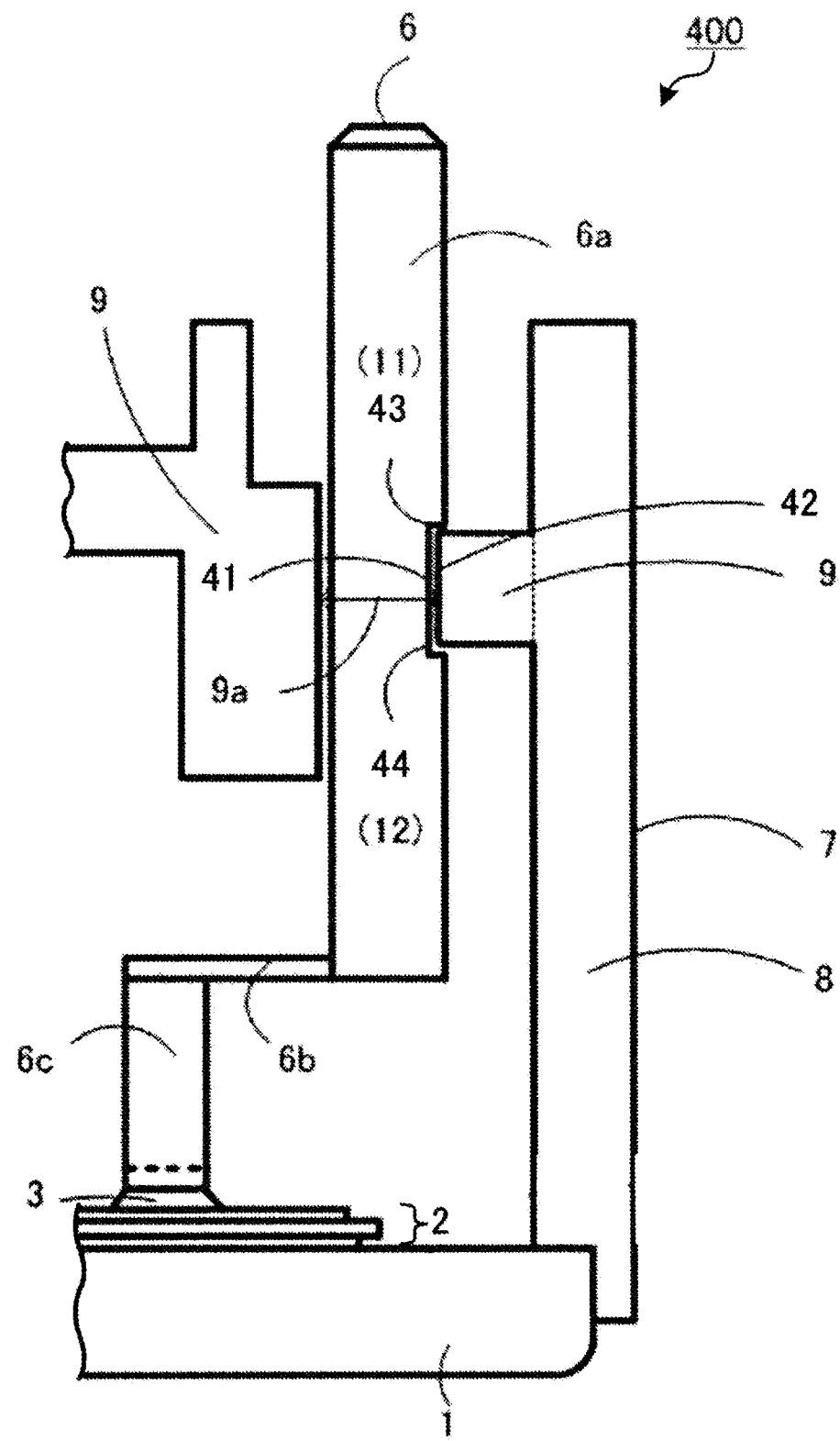
FIG. 13 is a cross-sectional diagram illustrating main components of a semiconductor device according to a fourth embodiment of the present invention.
Figure 14:
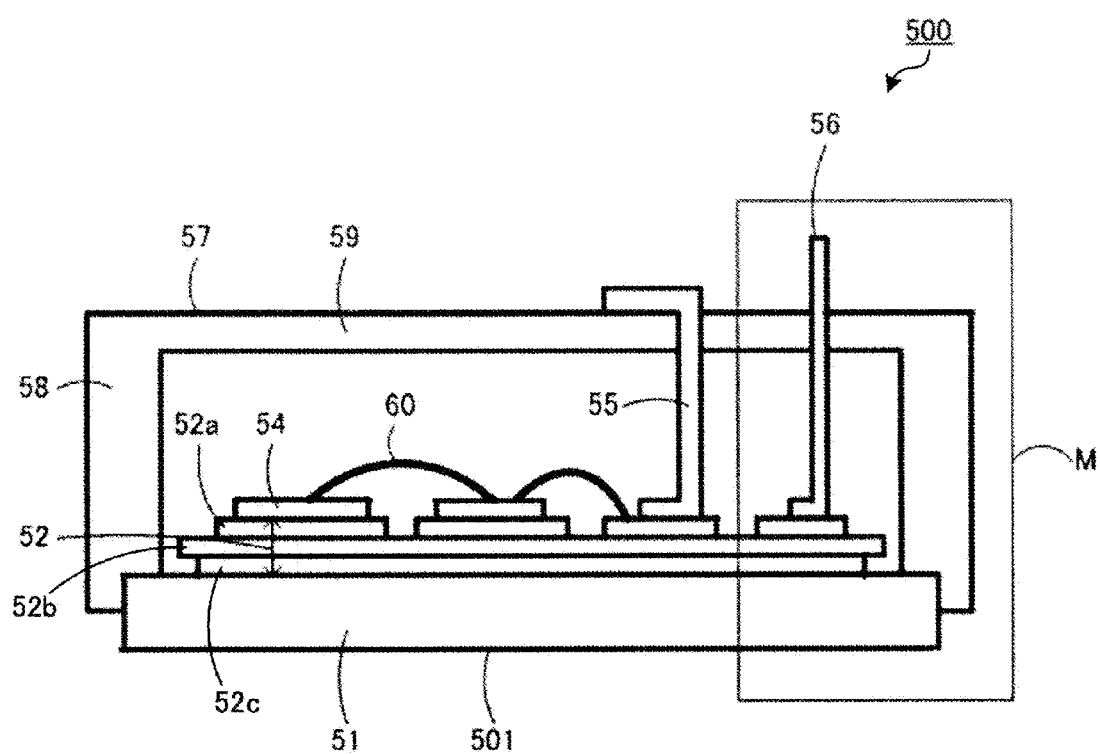
FIG. 14 is a schematic cross-sectional diagram illustrating a power module in the related art.
Figure 15:
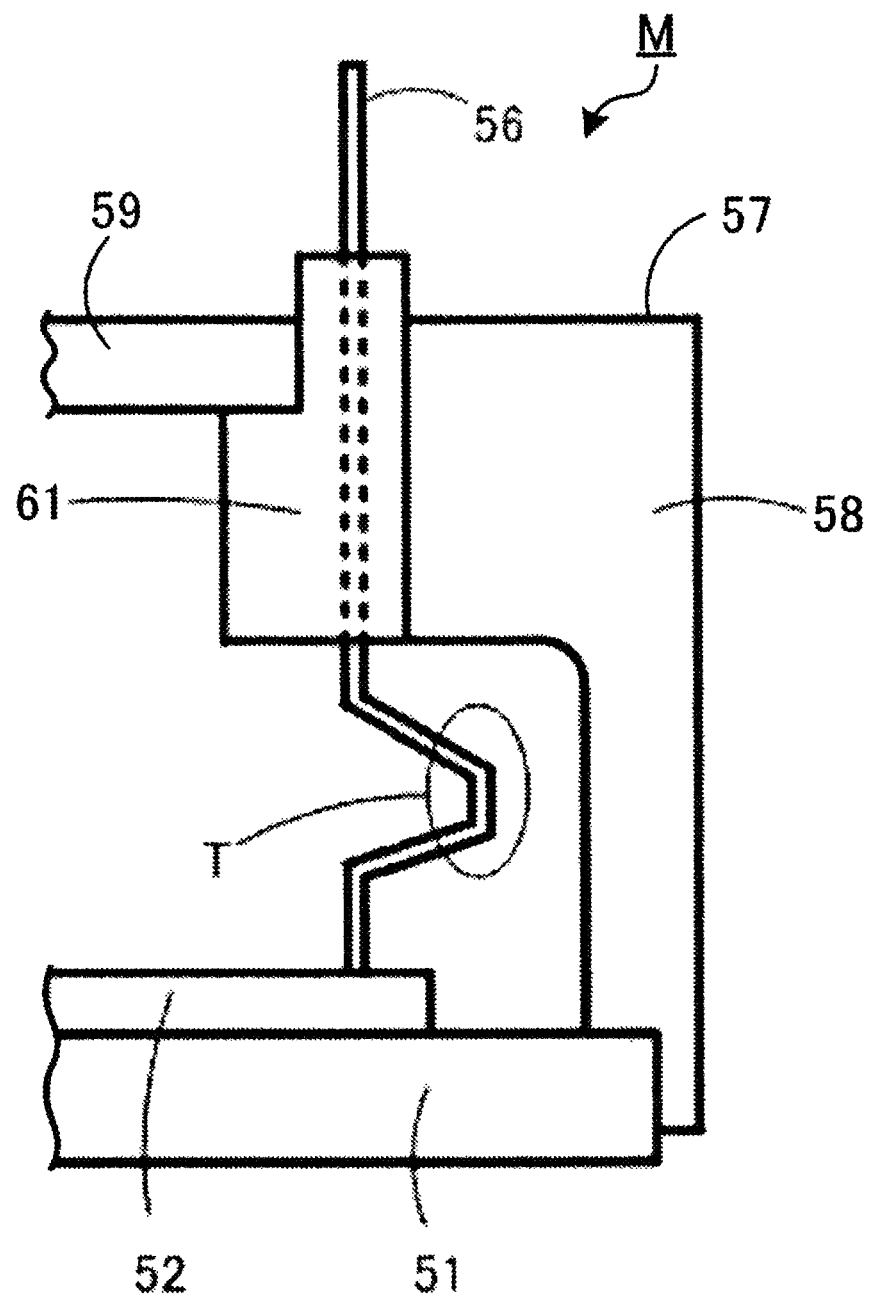
FIG. 15 is a cross-sectional diagram illustrating main components in the vicinity of a control terminal of the power module illustrated in FIG. 14.
Figure 16:
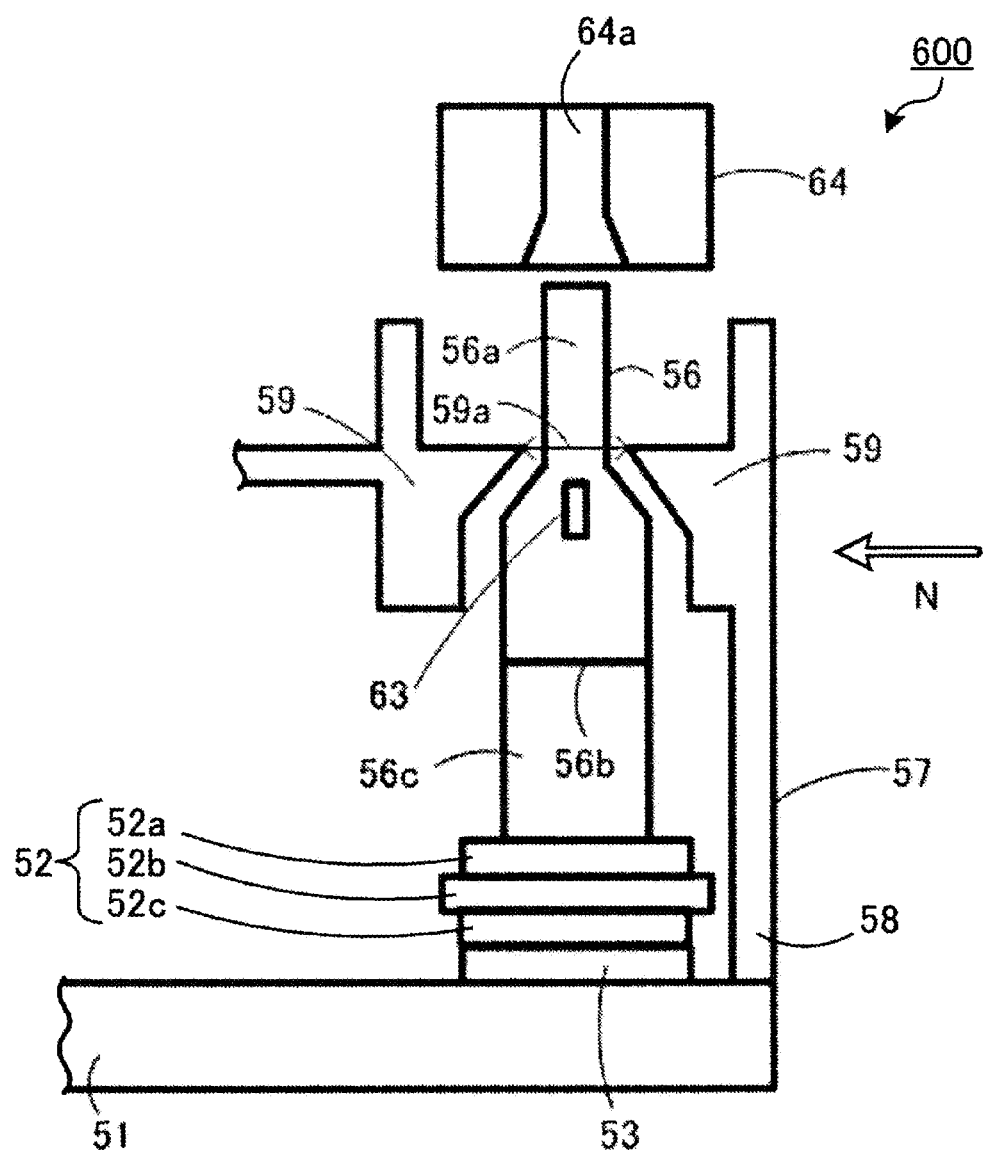
FIG. 16 (which includes FIGS. 16(a) and 16(b)) is a cross-sectional diagram illustrating main components of a power module in another example of the related art.
Figure 16:
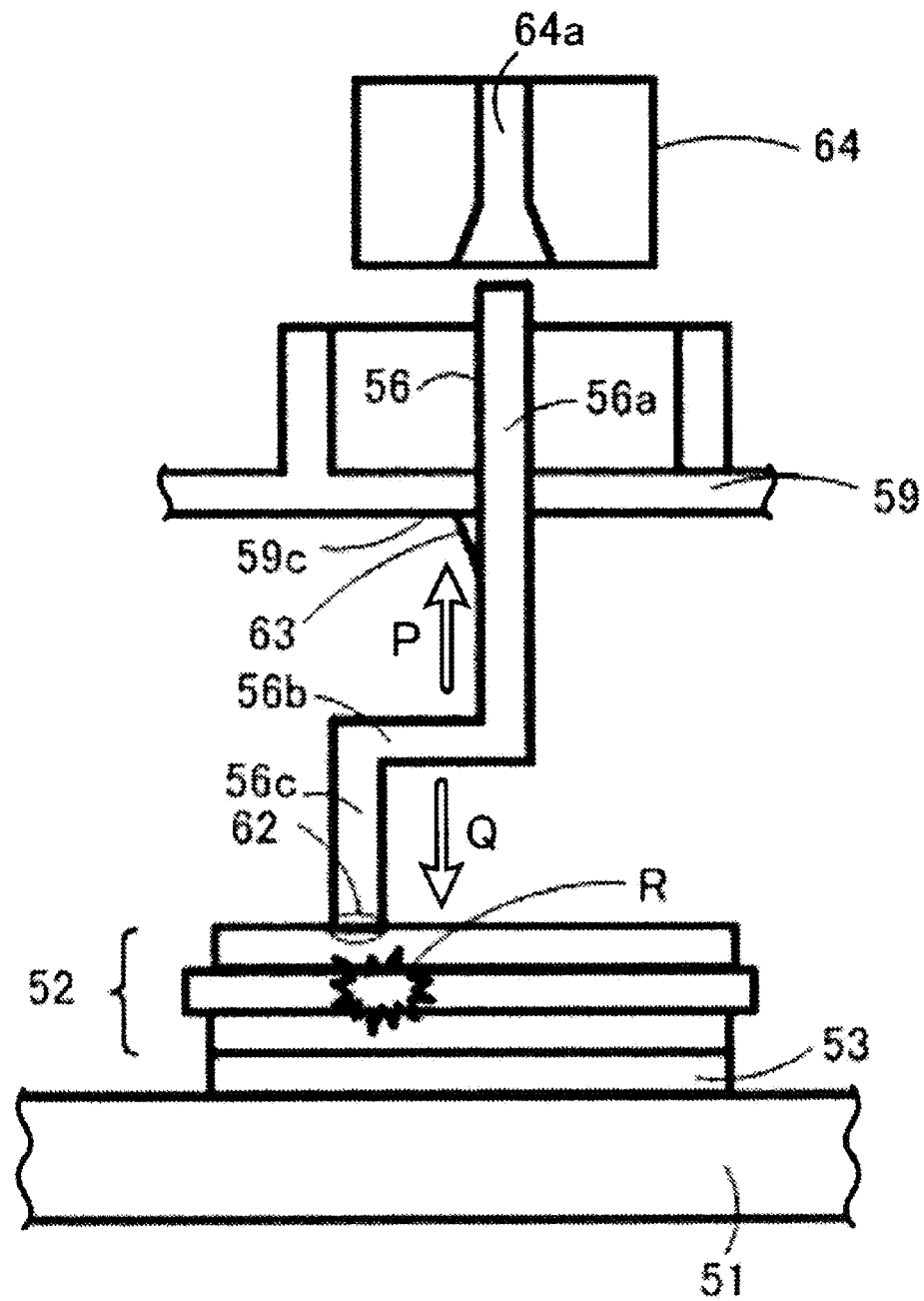

FIG. 13 is a cross-sectional diagram illustrating main components of a semiconductor device according to a fourth embodiment of the present invention. FIG. 13 illustrates cross-sectional diagram of main components at the time of inserting the control terminal 6 constituting a power module 400 into the resin case 7.

The power module 400 according to the fourth embodiment is different from the power module according to the third embodiment in that a notch portion 41 is installed in a portion interposed between the first and second protrusion portions as a substitute for the first and second protrusion portions of the power module according to the third embodiment. The sidewall 42 of the penetration hole 9a formed in the cover 9 is fit into the notch portion 41. More specifically, the sidewall 42 of the penetration hole 9a of the cover 9 is in contact with the bottom surface of the notch portion 41, which is parallel to the side surface 6aa of the penetration portion 6a. In addition, the front surface and the rear surface of the cover 9 are in contact with an upper sidewall 43 and a lower sidewall 44 of the notch portion 41, respectively. The upper sidewall 43 of the notch portion 41 is a surface which is substantially perpendicular to the bottom surface of the notch portion 41. The lower sidewall 44 of the notch portion 41 is a surface which is substantially perpendicular to the bottom surface of the notch portion 41 and faces the upper sidewall 43 of the notch portion 41. In this manner, the notch portion 41 is installed, so that at the time of detaching the connector (not illustrated), the movement of the control terminal 6 is stopped. Therefore, it is possible to prevent a stress from being transferred to the insulating substrate 2 through the control terminal 6.

In the power module 400, the upper sidewall 43 of the notch portion 41 is the first stopping portion 11, and the lower sidewall 44 of the notch portion 41 is the second stopping portion 12. In addition, the surface (front surface) of the cover 9 which directs the side opposite to the surface of the cover 9 which directs the metal base 1 side is the first fastening portion. The surface of the cover 9 which directs the metal base 1 side, that is, the surface (rear surface) of the cover 9 which faces the front surface of the metal base 1 is the second fastening portion. In addition, in the power module 400, the L-shaped processed portion 6b of the control terminal 6 may not be installed. Therefore, similarly to the power module according to the second embodiment, the penetration portion 6a and the connection portion 6c of the control terminal 6 may be connected to each other so as to be aligned in a straight line.

As described hereinbefore, according to the semiconductor device of the fourth embodiment, since the notch portion 41 is installed in the penetration portion 6a of the control terminal 6, the upper sidewall 43 and the lower sidewall 44 of the notch portion 41 are in contact with the front surface and the rear surface of the cover 9 of the resin case 7, respectively, so that the control terminal 6 is fixed. Therefore, it is possible to obtain the same effects as those of the semiconductor device according to the first embodiment.

In the present invention, examples of a power module where a plurality of semiconductor chips such as IGBT chips or FWD chips are mounted to a circuit pattern of an insulating substrate through solder are described, but the present invention is not limited thereto. The present invention can be applied to a package of modules having various configurations. In addition, in the above-described embodiments, examples of a control terminal including an L-shaped processed portion forming an L shape together with a penetration portion are described, but the present invention is not limited thereto. The control terminal may have a configuration where the control terminal is in contact with a convex portion installed in a rear-surface side of a cover of a case, so that the control terminal can be fastened. More specifically, for example, the control terminal may have a configuration where the control terminal includes a T-shaped processed portion forming a T shape together with the penetration portion or a processed portion having an acute angle with respect to the penetration portion as a substitute for the L-shaped processed portion.

In this manner, a semiconductor device according to the present invention can be usefully applied to a semiconductor device such as a power semiconductor module where a plurality of semiconductor chips is contained in the same package.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments and/or drawings can be combined, as would be understood by one of skill in the art.

What is claimed is:

1. A semiconductor device comprising:
    an insulating substrate;
    a control terminal which is attached to the insulating substrate to be electrically connected to a semiconductor chip mounted to the insulating substrate;
    a case which the control terminal penetrates;
    a first stopping portion which prevents movement of the control terminal in a direction toward the insulating substrate; and
    a second stopping portion which prevents movement of the control terminal in a direction away from the insulating substrate,
    wherein the control terminal includes:
    a penetration portion which penetrates a cover of the case; and
    an L-shaped member which is connected to the penetration portion to be substantially perpendicular to the penetration portion to form an L shape together with the penetration portion and is in contact with a rear surface of the cover of the case,
    wherein the control terminal includes a protrusion portion which is installed in the penetration portion and is in contact with a front surface of the cover of the case,
    wherein the first stopping portion is the protrusion portion, and
    wherein the second stopping portion is the L-shaped member;
    wherein the control terminal further includes a connection portion of which one end is connected to a bottom surface portion of the L-shaped member and of which another end is attached to the insulating substrate, with the connection portion having a straight shape,
    wherein a side surface of the L-shaped member is substantially perpendicular to a side surface of the penetration portion,
    wherein a side surface of the connection portion is substantially perpendicular to the side surface of the L-shaped member and is substantially parallel to the side surface of the penetration portion, and
    wherein the protrusion portion is formed with the side surface of the penetration portion.

2. The semiconductor device according to claim 1,
    wherein the protrusion portion is in contact with a protrusion receiving portion which is configured with the front surface of the cover of the case, and
    wherein the L-shaped member is in contact with a convex portion which is formed in a rear surface of the cover of the case.

3. The semiconductor device according to claim 1, wherein the penetration portion, the L-shaped member, and the connection portion of the control terminal is a continuous member which is cut out from one sheet of a metal plate.

4. The semiconductor device according to claim 1,
    wherein the control terminal includes a penetration portion which penetrates a cover of the case,
    wherein the control terminal includes a first protrusion portion which is installed to the penetration portion and is in contact with a front surface of the cover of the case,
    wherein the control terminal includes a second protrusion portion which is installed in the penetration portion to be separated from the first protrusion portion and is in contact with a rear surface of the cover of the case,
    wherein the first stopping portion is the first protrusion portion, and
    wherein the second stopping portion is the second protrusion portion.

5. The semiconductor device according to claim 4, wherein the control terminal further includes:
    an L-shaped member which is connected to the penetration portion to be substantially perpendicular to the penetration portion to form an L shape together with the penetration portion; and
    a connection portion of which the one end is connected to a bottom surface portion of the L-shaped member and of which the other end is attached to the insulating substrate.

6. The semiconductor device according to claim 1,
    wherein the control terminal includes a penetration portion which penetrates a cover of the case,
    wherein the control terminal includes a notch portion which is installed in the penetration portion to interpose the cover of the case and is in contact with front and rear surfaces of the cover of the case,
    wherein the first stopping portion is a sidewall of the notch portion which is in contact with the front surface of the cover of the case, and
    wherein the second stopping portion is a sidewall of the notch portion which is in contact with the rear surface of the cover of the case.

7. The semiconductor device according to claim 6, wherein the control terminal further includes:
    an L-shaped member which is connected to the penetration portion to be substantially perpendicular to the penetration portion to form an L shape together with the penetration portion; and
    a connection portion of which the one end is connected to a bottom surface portion of the L-shaped member and of which the other end is attached to the insulating substrate.

8. The semiconductor device according to claim 1,
    wherein the penetration portion and the connection portion of the control terminal are disposed separately from each other on the L-shaped member.

9. The semiconductor device according to claim 1,
    wherein the control terminal is formed from a metal plate,
    wherein the penetration portion is linked to the L-shaped member so that the longitudinal direction of the penetration portion is perpendicular to the longitudinal direction of the L-shaped member, and the L-shaped member is linked to the connection portion so that the longitudinal direction of the L-shaped member is perpendicular to the longitudinal direction of the connection portion, and
    wherein an end of the penetration portion and an end of the connection portion each extend in directions opposite to each other.

10. The semiconductor device according to claim 9,
    wherein the side surface of the L-shaped member at the bottom surface portion of the L-shaped member is formed by bending the metal plate to be substantially perpendicular to the side surface of the penetration portion along an edge portion of the L-shaped member in its longitudinal direction, and wherein the side surface of the connection portion is formed by bending the metal plate at a side opposite to the penetration portion, such that the side opposite to the penetration portion is substantially perpendicular to the side surface of the L-shaped member at the bottom surface portion of the L-shaped member along the edge portion of the L-shaped member in its longitudinal direction, and to be substantially parallel to the side surface of the penetration portion.

11. A semiconductor device comprising:
an insulating substrate;
a case which covers the insulating substrate;
a control terminal which is attached to the insulating substrate and penetrates the case;
a first stopping portion which is installed in a portion of the control terminal, which is exposed to an outer side of the case, to be in contact with the case from the outer side of the case; and
a second stopping portion which is installed in a portion of the control terminal, which is in an inner side of the case, to be in contact with the case from the inner side of the case,
wherein the control terminal includes:
a penetration portion which penetrates a cover of the case; and
an L-shaped member which is connected to the penetration portion to be substantially perpendicular to the penetration portion to form an L shape together with the penetration portion and is in contact with a rear surface of the cover of the case,
wherein the control terminal includes a protrusion portion which is installed in the penetration portion and is in contact with a front surface of the cover of the case,
wherein the first stopping portion is the protrusion portion, and
wherein the second stopping portion is the L-shaped member;
wherein the control terminal further includes a connection portion of which one end is connected to a bottom surface portion of the L-shaped member and of which another end is attached to the insulating substrate, with the connection portion having a straight shape,
wherein a side surface of the L-shaped member is substantially perpendicular to a side surface of the penetration portion,
wherein a side surface of the connection portion is substantially perpendicular to the side surface of the L-shaped member and is substantially parallel to the side surface of the penetration portion, and
wherein the protrusion portion is formed with the side surface of the penetration portion.

12. A semiconductor device comprising:
a metal member;
an insulating substrate which is attached to a front surface of the metal member;
a semiconductor chip and a main terminal which are attached to a circuit pattern of the insulating substrate;
a case which is attached to the metal member to cover a front-surface side of the metal member;
a penetration hole which is installed in the case;
a control terminal which includes a connection portion attached to the circuit pattern, a penetration portion supported by the penetration hole, a first stopping portion formed in the penetration portion, and a second stopping portion formed in the penetration portion;
a first fastening portion which is configured to include a sidewall of the penetration hole and a front surface of the case and is in contact with the first stopping portion so as to fasten the first stopping portion; and
a second fastening portion which is configured to include a sidewall of the penetration hole and a rear surface of the case and is in contact with the second stopping portion so as to fasten the second stopping portion,
wherein the control terminal further includes:
an L-shaped member which is connected to the penetration portion to be substantially perpendicular to the penetration portion to form an L shape together with the penetration portion and is in contact with a rear surface of the cover of the case,
wherein the control terminal further includes a protrusion portion which is installed in the penetration portion and is in contact with a front surface of the cover of the case,
wherein the first stopping portion is the protrusion portion, and
wherein the second stopping portion is the L-shaped member;
wherein the control terminal further includes a connection portion of which one end is connected to a bottom surface portion of the L-shaped member and of which another end is attached to the insulating substrate, with the connection portion having a straight shape,
wherein a side surface of the L-shaped member is substantially perpendicular to a side surface of the penetration portion,
wherein a side surface of the connection portion is substantially perpendicular to the side surface of the L-shaped member and is substantially parallel to the side surface of the penetration portion, and
wherein the protrusion portion is formed with the side surface of the penetration portion.

* * * * *